(12) United States Patent
Lawson et al.

(10) Patent No.: US 9,152,043 B2
(45) Date of Patent: Oct. 6, 2015

(54) NEGATIVE TONE MOLECULAR GLASS RESISTS AND METHODS OF MAKING AND USING SAME

(75) Inventors: Richard A. Lawson, Atlanta, GA (US); Clifford L. Henderson, Douglasville, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 394 days.

(21) Appl. No.: 12/994,057

(22) PCT Filed: May 22, 2009

(86) PCT No.: PCT/US2009/045069
§ 371 (c)(1),
(2), (4) Date: Nov. 22, 2010

(87) PCT Pub. No.: WO2009/143482
PCT Pub. Date: Nov. 26, 2009

(65) Prior Publication Data
US 2011/0097668 A1    Apr. 28, 2011

Related U.S. Application Data

(60) Provisional application No. 61/055,302, filed on May 22, 2008.

(51) Int. Cl.
*G03F 7/004* (2006.01)
*G03F 7/028* (2006.01)
(Continued)

(52) U.S. Cl.
CPC .............. *G03F 7/0045* (2013.01); *G03F 7/028* (2013.01); *G03F 7/029* (2013.01); *G03F 7/031* (2013.01); *G03F 7/038* (2013.01); *G03F 7/30* (2013.01); *G03F 7/38* (2013.01); *G03F 7/0047* (2013.01)

(58) Field of Classification Search
None
See application file for complete search history.

(56) References Cited

U.S. PATENT DOCUMENTS

2007/0123736 A1* 5/2007 Nishikubo et al. ............ 568/632
2007/0128541 A1* 6/2007 Kojima et al. ............. 430/270.1
2009/0042123 A1* 2/2009 Kinoshita et al. .......... 430/270.1

FOREIGN PATENT DOCUMENTS

JP    2012-68652    *  4/2012
WO   2006/132139       12/2006

OTHER PUBLICATIONS

Dai et al ("Molecular Glass Resists for High-Resolution Patterning", Chemistry of Materials, vol. 18 (15), p. 3404-3411 (2006)).*

(Continued)

*Primary Examiner* — Sin Lee
(74) *Attorney, Agent, or Firm* — Troutman Sanders LLP; Ryan A. Schneider; Troy S. Kleckley

(57) ABSTRACT

The various embodiments of the present disclosure relate generally to resists and, more particularly, to negative tone molecular glass resists, and their associated methods of fabrication and use. In one embodiment of the present invention, a negative tone molecular glass-based resist comprises: a molecular glass, comprising, a molecular glass core, wherein the molecular glass core is not a polymer chain, and a functional group bound to the molecular glass core and configured to provide a decrease in solubility of the molecular glass; and an initiating component configured to produce a reactive species upon exposure to radiation, wherein the reactive species facilitates the decrease in solubility of the molecular glass.

17 Claims, 8 Drawing Sheets

(51) Int. Cl.
  *G03F 7/029* (2006.01)
  *G03F 7/031* (2006.01)
  *G03F 7/30* (2006.01)
  *G03F 7/38* (2006.01)
  *G03F 7/038* (2006.01)

(56) References Cited

OTHER PUBLICATIONS

Derwent English abstract for WO 2006/132139 A1 (2006).*
Machine-assisted English translation of JP 2012-68652, which is an equivalent document of Echigo et al (WO 2006/132139 A1).*
Lawson, Richard Et Al.: "Influence of Solubility Switching Mechanism on Resist Performance in Molecular Glass Resists", Journal of Vacuum Science and Technology: Part B, Avs/Aip, Mellville, New York, NY, Us, vol. 25., No. 6, Dec. 7, 2007, pp. 2140-2144, Xpo12105438, ISSN: 1071-1023, DOI: 10.1116/1.2801885.
Sailer, H. et al.: "High resolution electron beam lithography using a chemically amplified calix[4]arene based resist", Journal of Vacuum Science and Technology B, vol. 22, 2004, pp. 3485-3488.
Oh, Tae-Hwan: "Negative nanomolecular resists based on Calix[4]resorcinarene", Proceedings of SPIE, vol. 6153, Jan. 1, 2006, pp. 61532G-61532G-10, XP55021249, ISSN: 0277-786X, DOI: 10.1117/12.660111.
European Search Report for related European Application 09751710, (2012).

* cited by examiner

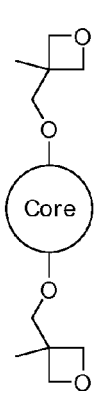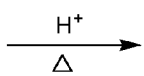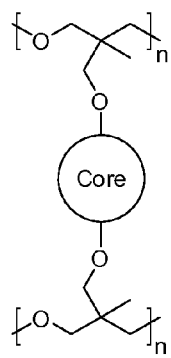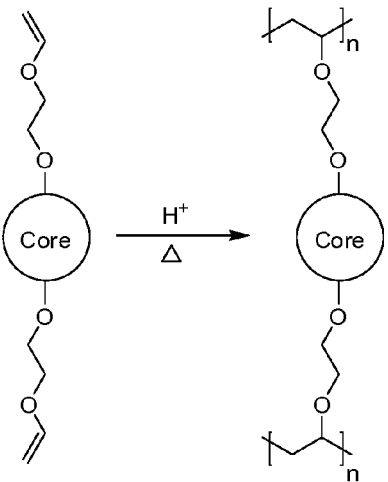
FIGURE 1
FIGURE 2
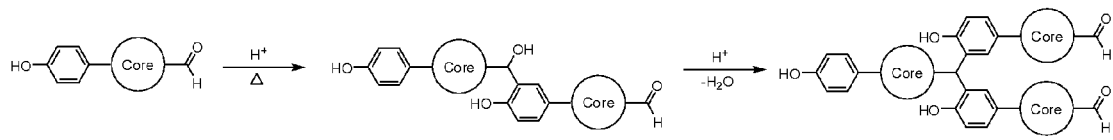
FIGURE 3
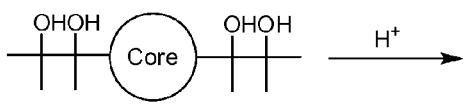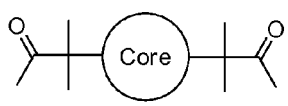
FIGURE 4
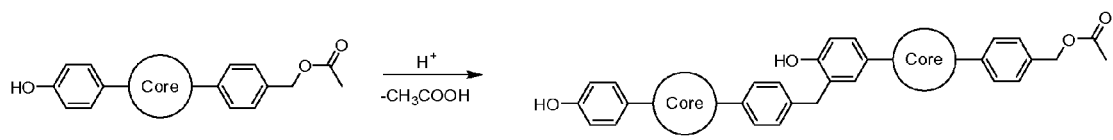
FIGURE 5

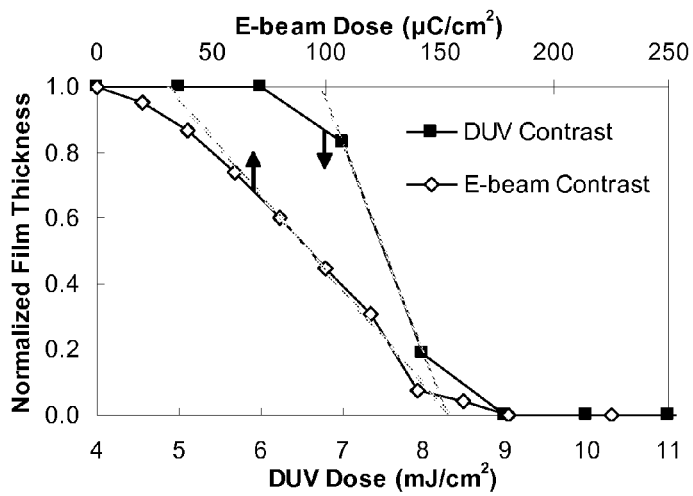
FIGURE 16
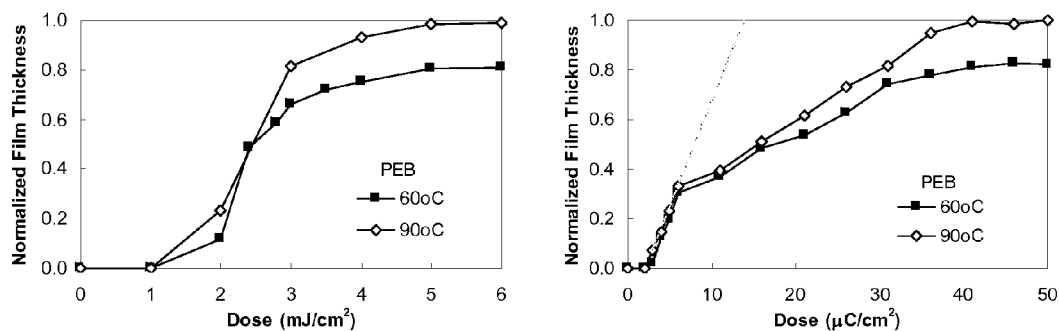
FIGURE 17
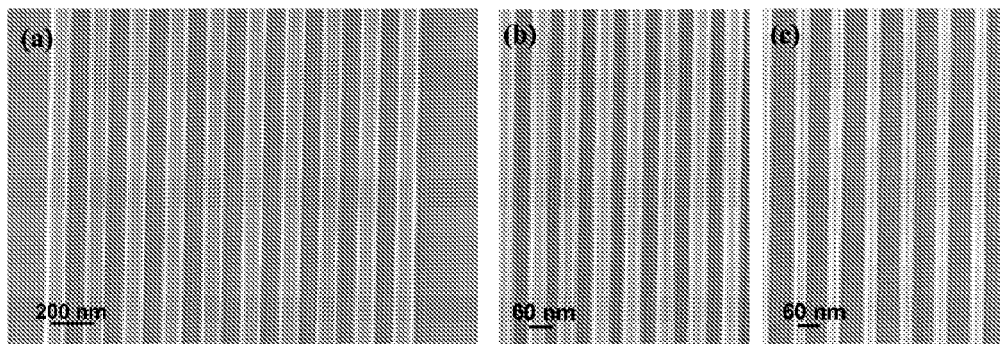
FIGURES 18 A-C

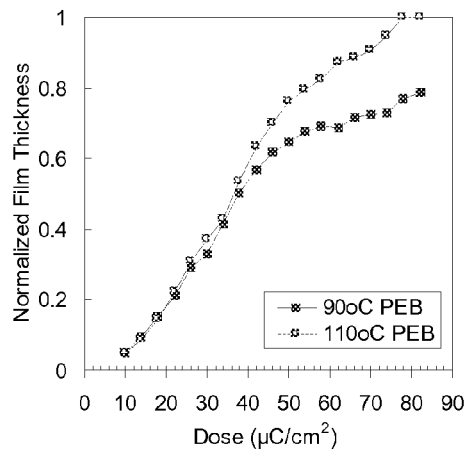
FIGURE 22
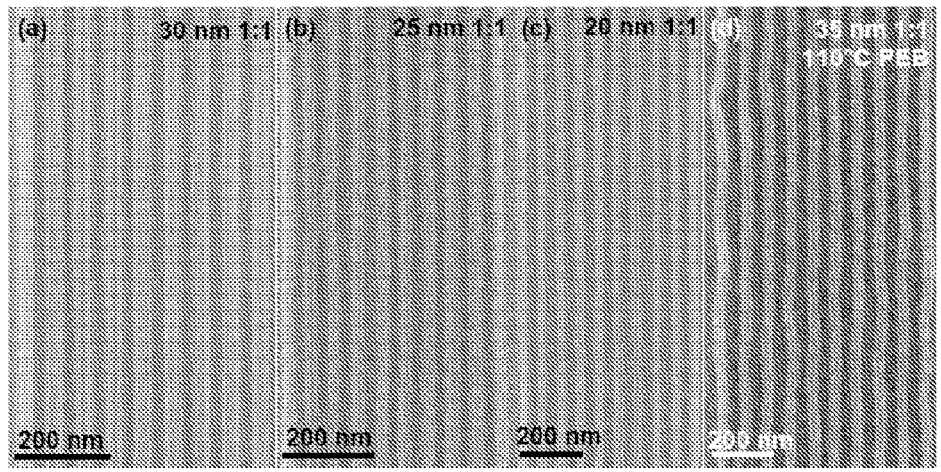
FIGURES 23 A-D
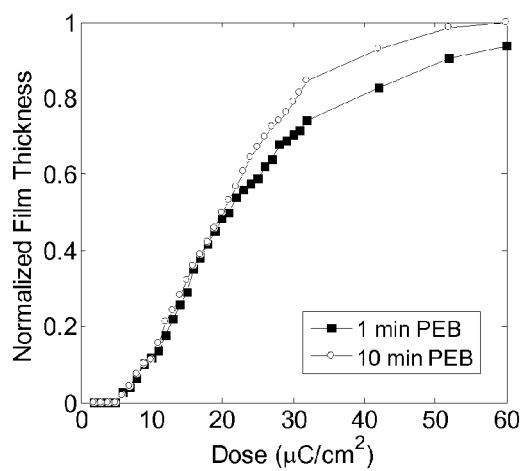
FIGURE 24

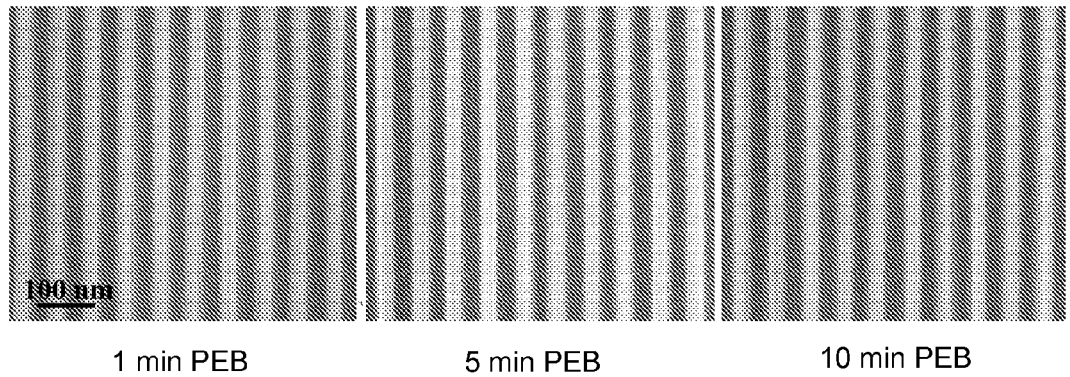
1 min PEB    5 min PEB    10 min PEB
FIGURE 25
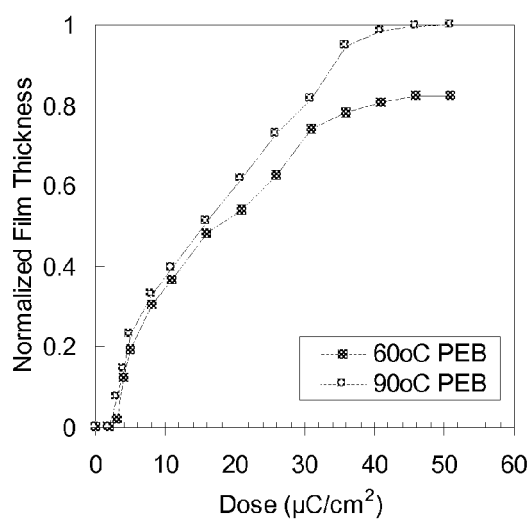
FIGURE 26
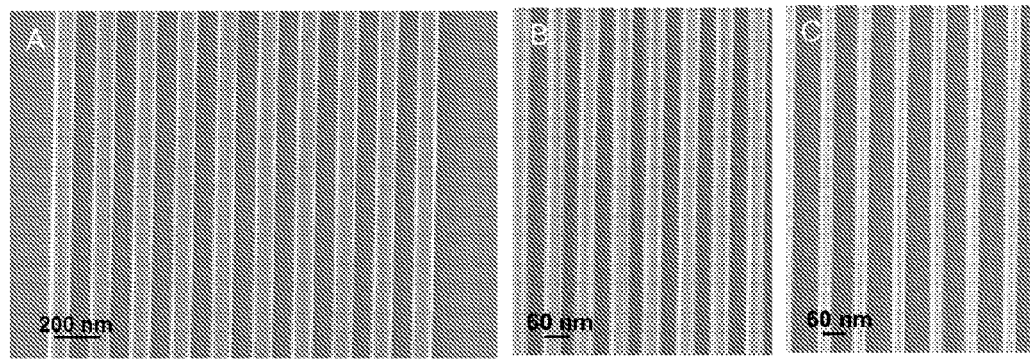
FIGURES 27 A-C

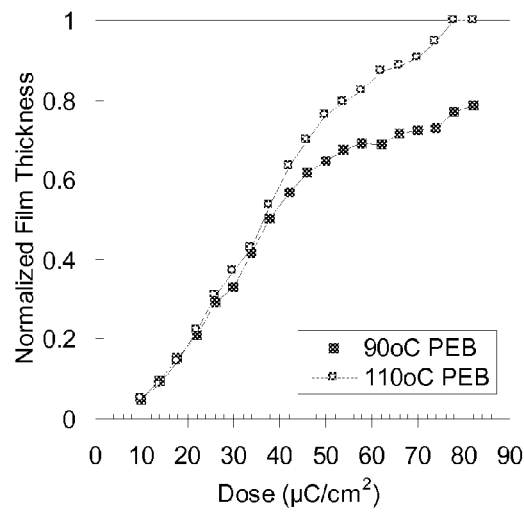
FIGURE 28
FIGURES 29 A-C
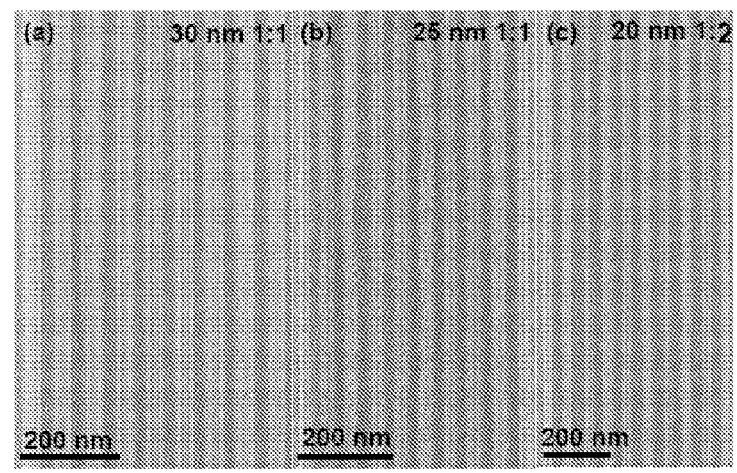
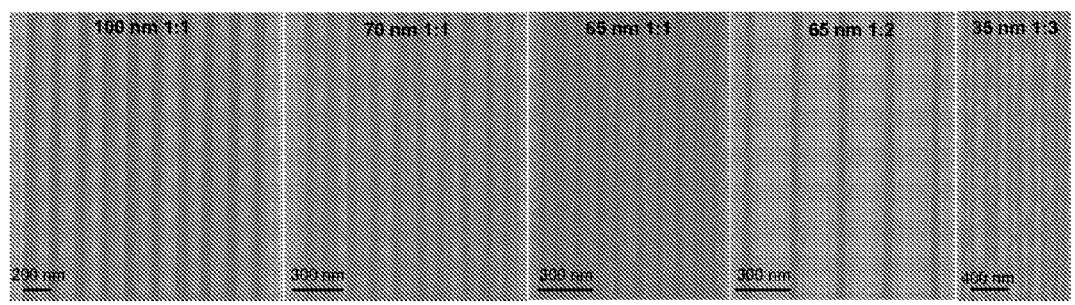
FIGURE 30

NEGATIVE TONE MOLECULAR GLASS RESISTS AND METHODS OF MAKING AND USING SAME

CROSS-REFERENCE TO RELATED APPLICATION

This application is a U.S. National Stage Patent Application of International Patent Application Serial No. PCT/US2009/045069, filed 22 May 2009, which claimed, under 35 U.S.C. §119(e) the benefit of U.S. Provisional Patent Application Ser. No. 61/055,302, filed 22 May 2008, the entire contents and substance of which are hereby incorporated by reference as if fully set forth below.

TECHNICAL FIELD

The various embodiments of the present disclosure relate generally to resists and, more particularly, to negative tone molecular glass resists, and their associated methods of fabrication and use.

BACKGROUND

Generally, photolithography comprises deposition of a light-sensitive resist or photoresist material on a substrate, and a portion of the light-sensitive resist material is exposed to a source of radiation through a mask. As a result of exposure, the photoresist may become either more or less soluble in a developer solution. That is, the solubility of the exposed regions of the photoresist may be switched (i.e., solubility switching) and the soluble portions of the photoresist are removed during development.

In recent years, molecular glass photoresists have received significant attention as potential replacements for polymer-based photoresists in sub-65 nanometer (nm) advanced photolithography. Among the perceived advantages of molecular resists over polymers are at least: (1) they can be repeatedly synthesized with precise molecular weight, compositional, and stereochemical control, and (2) their much smaller molecular size and consistent molecular composition should improve dissolution inhomogeneity which can reduce line-edge-roughness (LER). Molecular resists have been shown, both in simulation and experiment, to provide improvements in LER compared to polymer resists.

Although molecular glass materials may offer many potential advantages over polymeric CARs, there are still many things that are unknown about this class of materials that could potentially cause problems. Removal and subsequent volatilization of protecting groups in positive tone molecular resists can cause a loss of up to approximately 50% of the mass of the resist, possibly leading to a loss of pattern quality. The small sizes of molecular resist compounds, and often correspondingly low glass transition temperatures, can also lead to problems, such as more significant photo-acid diffusion and reduced mechanical strength and integrity.

Accordingly, there is a need for improved molecular glass resists. It is to the provision and characterization of such molecular glass resists that the various embodiments of the present invention are directed.

BRIEF SUMMARY OF THE INVENTION

The various embodiments of the present disclosure relate generally to resists. More particularly, some embodiments of the present invention are directed to negative tone molecular glass resists, and their associated methods of fabrication and use.

A negative tone molecular glass-based resist, according to some embodiments of the present invention, includes a molecular glass and an initiating component. The molecular glass can include a molecular glass core, wherein the molecular glass core is not a polymer chain, and a functional group bound to the molecular glass core and configured to provide a decrease in solubility of the molecular glass. The initiating component can be configured to produce a reactive species upon exposure to radiation, wherein the reactive species facilitates the decrease in solubility of the molecular glass.

A molecular glass comprises a molecular glass core and a functional group bound to the molecular glass core. A molecular glass core can be made of many materials, including, but not limited to, a polyphenol, a cyclic compound (e.g., a calixarene), an arylbenzene, a steroid, a sterol, a cholate, or a spiroatom. A functional group can comprise a plurality of functional groups, each of which are bound to the molecular glass core. In one embodiment of the present invention, each functional group of the plurality of functional groups is configured to provide a decrease in solubility of the molecular glass. In another embodiment of the present invention, each functional group of the plurality of functional groups is identical. In some embodiments of the present invention, the initiating component can comprise a portion of the molecular glass.

In one embodiment of the present invention, the initiating component is a photo-acid generator. In such embodiments, the reactive species is a photo-acid. Accordingly, the photo-acid can catalyze a polymerization between functional groups of adjacent molecular glasses, thereby cross-linking the adjacent molecular glasses. In one embodiment, the photo-acid catalyzes a condensation between functional groups of adjacent molecular glasses. For example, the condensation can be a dehydration. In another embodiment of the present invention, the photo-acid catalyzes an intramolecular dehydration within the molecular glass. In another embodiment of the present invention, the photo-acid catalyzes a rearrangement between functional groups of adjacent molecular glasses. In another embodiment of the present invention, the photo-acid catalyzes an intramolecular rearrangement of the functional group within the molecular glass. In yet another embodiment of the present invention, the photo-acid catalyzes an esterification between functional groups of adjacent molecular glasses. In yet another embodiment of the present invention, the photo-acid catalyzes an etherification between functional groups of adjacent molecular glasses. In still another embodiment of the present invention, the photo-acid catalyzes an intramolecular etherification between two functional groups within the molecular glass.

In another embodiment of the present invention, the initiating component can be a photo-base generator. In such an embodiment, the reactive species is a photo-base. Accordingly, the photo-base reacts with functional groups of adjacent molecular glasses, thereby cross-linking the adjacent molecular glasses. In some embodiments of the present invention, the photo-base generator can comprise a portion of the molecular glass core of the molecular glass, wherein the photo-base reacts with a functional group of an adjacent molecular glass, thereby cross-linking the molecular glass with the adjacent molecular glass.

In another embodiment of the present invention, the initiating component can be a photo-radical generator. In such embodiments, the reactive species can be a free radical, and the free radical can catalyze a polymerization of the functional group of adjacent molecular glass molecules, thereby cross-linking the adjacent molecular glass molecules.

In another aspect of the present invention, a method of making a resist comprises: dispensing a negative tone molecular glass-based material on a substrate, wherein the negative tone molecular glass-based material comprises: a molecular glass, comprising: a molecular glass core, wherein the molecular glass core is not a polymer chain; and a functional group bound to the molecular glass core and configured to provide a decrease in solubility of the molecular glass; and an initiating component configured to produce a reactive species upon exposure to radiation, wherein the reactive species facilitates the decrease in solubility of the molecular glass; exposing at least a portion of the negative tone molecular glass-based material to radiation; and reducing the solubility of at least a portion of the exposed molecular glass-based material.

In one embodiment of the present invention, the method of making the resist can further comprise removing at least a portion of the molecular glass-based material that was not exposed to the radiation from the substrate. In an embodiment, the removing can comprise: contacting the molecular glass-based material with a developing agent; and dissolving or carrying the at least the portion of the molecular glass-based material that was not exposed to the radiation from the substrate. In one embodiment of the present invention, the reducing the solubility of at least a portion of the exposed molecular glass-based material occurs during a post-exposing thermal treatment.

In the various embodiments of making a resist, the radiation can comprise ultraviolet light (e.g., deep ultraviolet light), an electron beam, laser light, or radiation characterized by a wavelength that is less than or equal to about 50 nanometers.

In one embodiment of a method of making a resist, the initiating component of the negative tone molecular glass-based material can be a photo-acid generator. In such embodiments, the reactive species is a photo-acid. Accordingly, the reducing comprises a photo-acid catalyzed polymerization between functional groups of adjacent molecular glasses, thereby cross-linking the adjacent molecular glasses. In one embodiment, the reducing comprises a photo-acid catalyzed condensation between functional groups of adjacent molecular glasses. For example, the condensation can be a dehydration. In another embodiment, the reducing comprises a photo-acid catalyzed intramolecular dehydration within the molecular glass. In another embodiment, the reducing comprises a photo-acid catalyzed rearrangement between functional groups of adjacent molecular glasses. In another embodiment, the reducing comprises a photo-acid catalyzed intramolecular rearrangement of the functional group within the molecular glass. In yet another embodiment, the reducing comprises a photo-acid catalyzed esterification between functional groups of adjacent molecular glasses. In yet another embodiment, the reducing comprises a photo-acid catalyzed etherification between functional groups of adjacent molecular glasses. In still another embodiment, the reducing comprises a photo-acid catalyzed intramolecular etherification between two functional groups within the molecular glass.

In one embodiment of the present method, the initiating component of the negative tone molecular glass-based material is a photo-base generator. In such an embodiment, the reactive species is a photo-base. Accordingly, the reducing comprises a reaction between the photo-base and functional groups of adjacent molecular glasses, thereby cross-linking the adjacent molecular glasses. In one embodiment, the photo-base generator can comprises a portion of the molecular glass core of the molecular glass, and wherein the reducing comprises a reaction between the photo-base and a functional group of an adjacent molecular glass, thereby cross-linking the molecular glass with the adjacent molecular glass.

In an embodiment of the present method of making a resist, the initiating component of the negative tone molecular glass-based material is a photo-radical generator. In such embodiments, the reactive species is a free radical. Accordingly, the reducing comprises a free radical catalyzed polymerization of the functional group of adjacent molecular glass molecules, thereby cross-linking the adjacent molecular glass molecules.

Other aspects and features of embodiments of the present invention will become apparent to those of ordinary skill in the art, upon reviewing the following description of specific, exemplary embodiments of the present invention in conjunction with the accompanying figures.

BRIEF DESCRIPTION OF DRAWINGS

FIG. 1 schematically illustrates cationic polymerization of oxetane functionalized molecular glass resists.

FIG. 2 schematically illustrates cationic polymerization of vinyl ether functionalized molecular glass resists.

FIG. 3 schematically illustrates an acid catalyzed condensation.

FIG. 4 schematically illustrates an intramolecular rearrangement in a molecular glass resist via pinacol rearrangement.

FIG. 5 schematically illustrates an intermolecular rearrangement between molecular glass resists via removal of acetic acid to activate a molecule for cross-linking.

FIG. 16 shows contrast curves of THPE-tBoc under DUV and e-beam (100 keV) exposures.

FIG. 17 illustrates contrast curves for THPM-Ep under (a) DUV and (b) E-beam (100 keV).

FIGS. 18 A-C includes SEM images of e-beam patterning of (a) THPM-Ep-60 80 nm 1:1 line/space, (b) THPM-Ep-90 50 nm 1:1 line/space, and (c) THPM-Ep-90 30 nm 1:3 line/space.

FIG. 22 shows contrast curves for 2-Ep under e-beam (100 keV) for two different PEB conditions.

FIGS. 23 A-D include SEM images of line-space patterns achieved in 2-Ep using 100 keV e-beam patterning on $Si_3N_4$ membranes at a dose-to-size of 125 µC/cm² and a film thickness of 50-55 nm (a) 30 nm 1:1 line-space for PEB 90° C. (b) 25 nm 1:1 line-space for PEB 90° C. (c) 20 nm 1:2 line-space for PEB 90° C. (d) 35 nm 1:1 line-space for PEB 110° C.

FIG. 24 illustrates electron beam (100 keV) contrast curves for 4-Ep at two different 90° C. PEB times.

FIG. 25 include SEM images of 4-Ep demonstrating near identical 35 nm half-pitch resolution at 50 µC/cm² for three different PEB times at 90° C.

FIG. 26 demonstrates electron beam (100 keV) contrast curves for 3-Ep at two different PEB temperatures of 60° C. and 90° C.

FIGS. 27 A-C include SEM images of e-beam (100 keV) patterning of 3-Ep (a) 80 nm 1:1 line/space with a PEB of 60° C., (b) 50 nm 1:1 line/space with a PEB of 90° C., and (c) 30 nm 1:3 line/space with a PEB of 90° C.

FIG. 28 shows electron beam (100 keV) contrast curves for 2-Ep at two different PEB temperatures of 90° C. and 110° C.

FIGS. 29 A-C include SEM images of e-beam (100 keV) patterning of 2-Ep with a PEB of 90° C. (a) 30 nm 1:1 line/space, (b) 25 nm 1:1 line/space, and (c) 20 nm 1:2 line/space.

FIG. 30 include SEM images of e-beam (100 keV) patterning of SU-8 with a PEB of 60° C. for a variety of line/space patterns.

DETAILED DESCRIPTION

Figure 6:
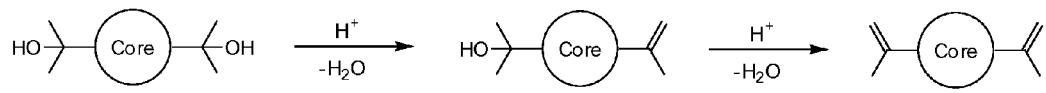
FIG. 6 schematically illustrates an intramolecular dehydration in a molecular glass resist via dehydration of a tertiary alcohol.

Referring now to the figures, wherein like reference numerals represent like parts throughout the several views, exemplary embodiments of the present invention will be described in detail. Throughout this description, various components may be identified having specific values or parameters, however, these items are provided as exemplary embodiments. Indeed, the exemplary embodiments do not limit the various aspects and concepts of the present invention as many comparable parameters, sizes, ranges, and/or values may be implemented. The terms "first," "second," and the like, "primary," "secondary," and the like, do not denote any order, quantity, or importance, but rather are used to distinguish one element from another. Further, the terms "a," "an," and "the" do not denote a limitation of quantity, but rather denote the presence of "at least one" of the referenced item.

As described above, the various embodiments of the present invention relate to negative tone molecular glass-based resists or photoresists, methods of making the resists, and methods of using the resists. The negative tone molecular glass-based resists, and their associated methods of manufacture and use, generally employ a (i.e., at least one) molecular glass. The molecular glass materials disclosed herein provide advantages over existing polymeric-based resists in that the molecular glasses can be synthesized in a manner that permits control over molecular weight, composition, and stereochemistry. Further, the smaller molecular size and controlled molecular composition of the molecular glasses described herein enables improved dissolution inhomogeneities that can result in reduced line-edge roughness (LER). Other advantages of the present molecular glass-based resists will be apparent to those skilled in the art to which this disclosure pertains.

The molecular glasses of the negative tone molecular glass-based resists generally include a core and a functional group that is bound to the core. In certain exemplary situations, the molecular glass includes more than one functional group bound to the molecular glass core. These functional groups can be the same or different from one another.

There is no particular limitation in the choice of composition used to form the molecular glass core, with the exception that the molecular glass core cannot be a polymer chain. Thus, the molecular glass core can be a dendrimer, a cyclic compound (e.g., an alicyclic compound, an aromatic compound, a heterocyclic compound, a macrocycle, a polycyclic compound containing any of the foregoing, or the like), or the like.

By way of example, the molecular core can be a dendrimeric polyphenol, such as those generally made via an acid-catalyzed condensation of a phenol, catechol, resorcinol, or the like with a ketone, aldehyde, tertiary alcohol, or the like. A few polyphenols of this type include 9,9-bis(4-hydroxyphenyl)fluorene, which has two hydroxyl groups; 1,1,1-tris(4-hydroxyphenyl)ethane, which has three hydroxyl groups; 1,1,2,2-tetrakis(4-hydroxyphenyl)ethane, which has four hydroxyl groups; and 1,3,5-tris(1,1-bis(4-hydroxyphenyl)ethyl)benzene, which has six hydroxyl groups. While it is not intended that a hydroxyl group of these polyphenols serve as the functional group that is bound to the molecular glass core, it is possible that in some embodiments it does serve this function.

Among the various cyclic compounds that can be used as the molecular glass core include calixarenes, arylbenzenes, steroids, sterols, cholates, spiroatom-containing compounds, or the like. Calixarenes encompass those compounds that are generally made via an acid- or base-catalyzed condensation of a phenol, resorcinol, pyrogallol, or the like with an aldehyde to produce a cyclic compound. A few calixarenes of this type include 4-tert-butylcalix[4]arenes, calix[4]arenes, C-alkyl calix[4]resorcinarenes, C-aryl calix[4]resorcinarenes, C-alkyl calix[4]pyrogallolarenes, and C-aryl calix[4]pyrogallolarenes.

Arylbenzenes include compounds where the majority/primary bonds that connect the rings are ring-ring biphenyl type of bonds. These compounds can be made using a variety of known synthetic techniques or reactions. Exemplary arylbenzene compounds include 1,3,5-tris(4-hydroxyphenyl)benzene, 1,2,3,4,5,6-hexa(4-hydroxyphenyl)benzene, and the like.

Steroids, sterols, and cholates include those compounds that generally have a carbon skeleton or backbone of four fused rings, and are often, but not always, derived from natural products. A few compounds of these types include cholic acid, deoxycholic acid, and lithocholic acid.

Spiroatom-containing compounds generally include at least two organic rings that are connected at only one atom, termed the spiroatom. These compounds can be made using a variety of known synthetic techniques or reactions. One example of a spiroatom-containing compound is 5,5',6,6'-tetrahydroxy-3,3,3',3'-tetramethyl-1,1'-spirobisindan.

While it is not intended that a functional group that exists on the types of cyclic compounds described above serve as the functional group that is bound to the molecular glass core, it is possible that in some embodiments it does serve this function.

The functional group or groups that are bound to the molecular glass core can be of any type, with the exception that the functional group cannot be a lactone. By way of example, the functional group can be an epoxide, oxetane, vinyl ether, aldehyde, hydroxyl, phenol, diol (e.g., a pinacol), tertiary alcohol, ester, carboxylic acid, ketone, acid anhydride, alkene, acrylate, methacrylate, or the like. The functional group that is bound to the molecular glass core is configured to provide the molecular glass with a decrease in solubility, as will be described in more detail below. When more than one functional group is bound to the molecular glass core, any number of those functional groups can be configured to provide the molecular glass with a decrease in solubility, regardless of whether the functional groups are the same or different from one another.

If the molecular glass core component does not include a functional group, then the molecular glass core will be modified to include a functional group. As described above, if any of the above-listed molecular glass core components includes a functional group, then that functional group is not intended to be the functional group of the overall molecular glass. The initial functional group on the molecular glass core will be converted to a different functional group to form the molecular glass. If, however, there are additional functional groups on the molecular glass core, then the additional functional groups can (but do not have to be) converted to a different functional group to form the molecular glass.

The functional group or groups can be bound to the molecular glass core component of the molecular glass using synthetic chemical techniques that are known to those skilled in the art to which this disclosure pertains.

In addition to the molecular glass, the negative tone molecular glass-based resists include an initiating component. The initiating component can be a separate compound, or it can be a functional group or moiety bound to the molecular glass. The initiating component can be configured to provide a reactive species upon exposure to radiation. It is the reactive species that facilitates (either directly or indirectly) the decrease in solubility of the molecular glass.

The initiating component can be, for example, a photo-acid generator (PAG), a photo-base generator (PBG), a photo-radical generator, or the like. Thus, when the initiating component is a photo-acid generator, the reactive species can be a photo-acid. Similarly, when the initiating component is a photo-base generator, the reactive species can be a photo-base; and, when the initiating component is a photo-radical generator, the reactive species can be a free radical.

Photo-acid generators can be ionic or non-ionic. These compounds are well known to those skilled in the art to which this disclosure pertains. Exemplary ionic PAGs include triphenylsulfonium hexafluoroantimonate, diphenyliodonium triflate, triphenylsulfonium nonaflate, and the like. It should be noted that triflates and nonaflates will generally not work when the functional group of the molecular glass is an epoxide. Exemplary non-ionic PAGs include nitrobenzyl tosylate, norbornene dicarboximidyl triflate, N-hydroxy-phthalimide nonaflate, and the like.

Photo-base generators can also be ionic or non-ionic. Like PAGs, PBGs are well known to those skilled in the art to which this disclosure pertains. Exemplary ionic PBGs include triphenylsulfonium hydroxide and the like; and exemplary non-ionic PBGs include nitrobenzyl carbamates and the like.

Photo-radical generators are also well known to those skilled in the art to which this disclosure pertains. Exemplary photo-radical generators include benzil, benzoin, benzophenone, and the like.

Figure 15:
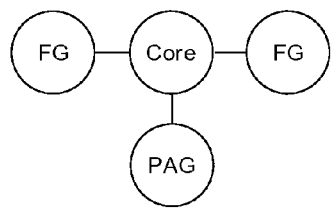
FIG. 15 is a schematic of a photo-acid generator or initiator covalently attached to the molecular glass core.

A schematic illustration of an exemplary embodiment of a single component negative tone molecular glass-based resist (wherein the initiating component is bound to the molecular glass core) is shown in FIG. 15.

The negative tone molecular glass-based resist materials described above can be used to form a resist on a substrate. For example, the negative tone molecular glass-based material can be disposed or dispensed on a surface of the substrate. This can be accomplished using known techniques, such as spin-coating, spraying, dipping, brushing, and the like.

In exemplary embodiments, spin coating is used to cover the substrate with the negative tone molecular glass-based material. By way of example, a liquid of the negative tone molecular glass-based material is dispensed onto the substrate, and the substrate is spun rapidly to produce a uniform layer of the negative tone molecular glass-based material thereon.

Once the negative tone molecular glass-based material has been placed on the surface of the substrate, it can optionally be subjected to a heat treatment to stabilize the negative tone molecular glass-based material or remove any excess negative tone molecular glass-based material.

The substrate, with the negative tone molecular glass-based material disposed thereon, then can be exposed to radiation. Upon exposure to radiation (e.g., ultraviolet light, deep UV light, an electron beam, laser light, light having a wavelength less than about 50 nanometers, 13.4-nanometer wavelength light, X-ray radiation, and the like), the initiating component of the negative tone molecular glass-based material is activated, and produces the reactive species. The reactive species then directly or indirectly reduces the solubility of at least a portion of the exposed molecular glass-based material.

After the exposure to radiation, the substrate (with the negative tone molecular glass-based material disposed thereon) can be subjected to an optional post-exposure heat treatment. In some cases, it is during the post-exposure heat treatment where a substantial portion of the reduction in solubility of at least a portion of the exposed molecular glass-based material occurs.

Finally, at least a portion of the unexposed negative tone glass-based material can be removed from the surface of the substrate. This can be accomplished, for example, by contacting the negative tone molecular glass-based material with a developing agent and, subsequently, dissolving or carrying at least a portion of the unexposed negative tone glass-based material from the surface of the substrate.

Developing agents for removing the unexposed negative tone glass-based material are known to those skilled in the art to which this disclosure pertains. By way of example, such developing agents include water, aqueous solutions of tetramethyl ammonium hydroxide (TMAH), any basic aqueous solution (e.g., potassium hydroxide, sodium hydroxide, TMAH, and the like), methyl isobutyl ketone (MIBK), propylene glycol monomethyl ether acetate (PGMEA), ethyl lactate, mesitylene, isopropanol, gamma-butyrolactone (GBL), tetrahydrofuran (THF), other organic solvents, and the like.

Once the desired amount of unexposed negative tone glass-based material has been removed, the resist can be used in further applications.

There are a variety of mechanisms by which the solubility of the desired portion(s) of the molecular glass can be reduced. These include a photo-acid catalyzed polymerization between functional groups of adjacent molecular glasses to cross-link the adjacent molecular glasses, photo-acid catalyzed condensation between functional groups of adjacent molecular glasses, photo-acid catalyzed dehydration between functional groups of adjacent molecular glasses, photo-acid catalyzed intramolecular dehydration within a molecular glass, photo-acid catalyzed rearrangement between functional groups of adjacent molecular glasses, photo-acid catalyzed intramolecular rearrangement of the functional group within a molecular glass, photo-acid catalyzed esterification between functional groups of adjacent molecular glasses, photo-acid catalyzed etherification between functional groups of adjacent molecular glasses, photo-acid catalyzed intramolecular etherification between two functional groups within a molecular glass, reaction between a photo-base and functional groups of adjacent molecular glasses to cross-link the adjacent molecular glasses, a reaction between a photo-base (generated from a photo-base generator that comprises a portion of the molecular glass core of a molecular glass) and a functional group of an adjacent molecular glass to cross-link a molecular glass with the adjacent molecular glass, free radical catalyzed polymerization of the functional group of adjacent molecular glass molecules to cross-link adjacent molecular glass molecules, and the like.

By way of illustration, various examples of such mechanisms are detailed below.

One example of a photo-acid catalyzed polymerization between functional groups of adjacent molecular glasses to cross-link the adjacent molecular glasses includes cationic polymerization or cross-linking of molecular glasses functionalized with oxetanes. The molecular glass-based resist molecules can be blended with a PAG that generates a non-nucleophilic photo-acid. The acid catalyzes the oxetane polymerization during a post-exposure bake, thereby cross-linking the molecular glasses. The increase in molecular weight of the resist renders it insoluble in a developing agent relative to the unexposed areas. Development can be carried out using organic solvents such as MIBK, PGMEA, or the like. FIG. 1 provides a schematic illustration of this mechanism.

Another example of a photo-acid catalyzed polymerization between functional groups of adjacent molecular glasses to cross-link the adjacent molecular glasses includes cationic polymerization or cross-linking of molecular glasses functionalized with vinyl ethers. FIG. 2 provides a schematic illustration of this mechanism. The molecular glass-based resist molecules can be blended with a PAG that generates a non-nucleophilic photo-acid. The acid catalyzes the vinyl ether polymerization during a post-exposure bake, thereby cross-linking the molecular glasses. The increase in molecular weight of the resist renders it insoluble in developer relative to the unexposed areas. Development can be carried out using organic solvents such as MIBK, PGMEA, and the like.

One example of a photo-acid catalyzed condensation between functional groups of adjacent molecular glasses includes acid catalyzed condensation or poly-condensation between aldehydes and phenols. Such a reaction is shown in FIG. 3. Molecular glass resists containing phenols and aldehydes or blends of the two are blended with a PAG that generates photo-acid. The acid catalyzes the condensation of the aldehyde and phenol during a post-exposure bake, thereby cross-linking the molecular glass molecules. The increase in molecular weight of the resist renders it insoluble in developer relative to the unexposed areas. Development can be carried out using solvents such as MIBK, PGMEA, or the like, or an aqueous solution of TMAH.

Figure 7:
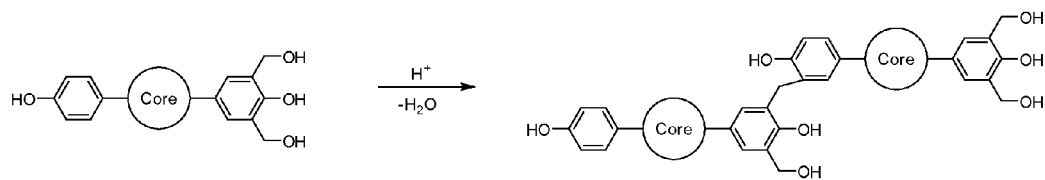
FIG. 7 schematically illustrates an intermolecular dehydration between molecular glass resists.

One example of a photo-acid catalyzed dehydration between functional groups of adjacent molecular glasses includes acid catalyzed dehydration of benzyl alcohols to cross-link with phenols on an adjacent molecular glass. This is schematically illustrated in FIG. 7. The various resist molecules are blended with a PAG that generates a photo-acid or other initiator. The acid catalytically activates the benzyl alcohol, generating a stabilized benzylic carbocation which then reacts with a phenol, releasing water and resulting in an increased molecular weight. Development can be carried out using solvents such as MIBK, PGMEA, or the like, or water or aqueous solutions of TMAH.

One example of a photo-acid catalyzed intramolecular dehydration within a molecular glass includes an acid catalyzed dehydration of tertiary alcohols. Such a mechanism is shown schematically in FIG. 6. The resist molecules are blended with a PAG that generates a photo-acid or another initiator. The acid catalyzes the dehydration of the tertiary alcohol, changing the pendant groups on the molecule from a hydrophilic alcohol to a hydrophobic alkene. The change in the hydrophobicity of the molecule renders it insoluble in developer relative to the unexposed areas. Development can be carried out using solvents such as isopropanol, or the like, or water or aqueous solutions of TMAH.

One example of a photo-acid catalyzed rearrangement between functional groups of adjacent molecular glasses includes an acid catalyzed removal of an alcohol that leads to reaction with a phenol on an adjacent molecular glass. This is shown schematically in FIG. 5. The resist molecules are blended with a PAG that generates a photo-acid or other initiator. The acid catalytically activates the benzyl acetate which then reacts with a phenol, releasing acetic acid and resulting in an increased molecular weight. The increase in molecular weight of the resist renders it insoluble in developer relative to the unexposed areas. Development can be carried out using solvents such as MIBK, PGMEA, or the like, or water or aqueous solutions of TMAH.

One example of a photo-acid catalyzed intramolecular rearrangement of the functional group within a molecular glass includes a pinacol rearrangement, as shown schematically in FIG. 4. The resist molecules are blended with a PAG that generates a photo-acid. The acid catalyzes the pinacol rearrangement of the vic-diol to a ketone, changing the pendant groups on the molecule from a hydrophilic diol to a hydrophobic ketone. The change in the hydrophobicity of the molecule renders it insoluble in developer relative to the unexposed areas. Development can be carried out using water or aqueous solutions of TMAH.

Figure 8:
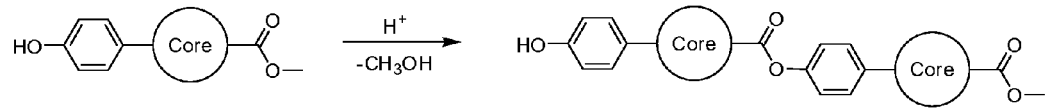
FIG. 8 schematically illustrates an intermolecular esterification between molecular glass resists.

One example of a photo-acid catalyzed esterification between functional groups of adjacent molecular glasses includes acid catalyzed trans-esterification between methyl esters and alcohols or phenols on adjacent molecules. This is shown schematically in FIG. 8. The resist molecules are blended with a PAG that generates a photo-acid or other initiator. The acid catalyzes a trans-esterification that activates the molecular glass such that it can react with an adjacent molecular glass to increase the molecular weight and/or reduce the hydrophilicity of the glasses, rendering them less soluble in developer relative to the unexposed areas. Development can be carried out using solvents such as MIBK, PGMEA, or the like, or water or aqueous solutions of TMAH.

Figure 9:
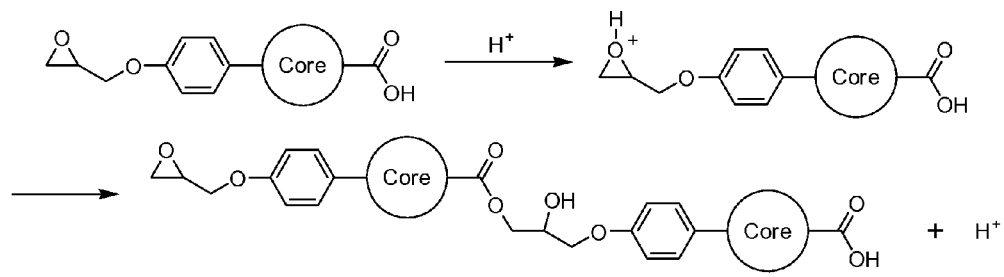
FIG. 9 schematically illustrates an intermolecular esterification between molecular glass resists.

Another example of a photo-acid catalyzed esterification between functional groups of adjacent molecular glasses includes an acid catalyzed epoxide ring opening by a carboxylic acid or anhydride group on an adjacent molecule. Such a reaction using a carboxylic acid is shown schematically in FIG. 9. The molecular glasses are blended with a PAG that generates a photo-acid or other initiator. The acid activates an epoxide or similar molecule such that it can react with carboxylic acids on adjacent molecules to increase the molecular weight and/or reduce the hydrophilicity of the molecule, rendering it less soluble in developer relative to the unexposed areas. Development can be carried out using solvents such as MIBK, PGMEA, or the like, or water or aqueous solutions of TMAH.

Figure 10:
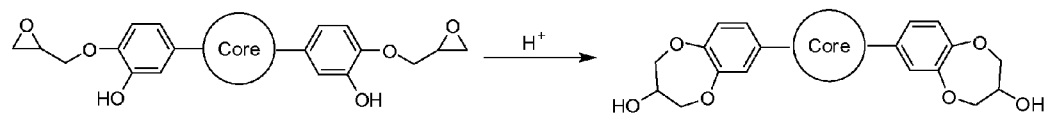
FIG. 10 schematically illustrates an intramolecular etherification in a molecular glass resist.

One example of a photo-acid catalyzed intramolecular etherification between two functional groups within a molecular glass includes an acid catalyzed epoxide ring opening by a hydroxyl group at an ortho position to a glycidyl ether. This is shown schematically in FIG. 10. The resist molecules are blended with a PAG that generates a photo-acid or other initiator. The acid activates an epoxide or similar functional group such that it can react with alcohols and phenols on adjacent sites of the same molecular glass to reduce the hydrophilicity of the molecular glass, rendering it less soluble in developer relative to the unexposed areas. Development can be carried out using solvents such as isopropanol, or water or aqueous solutions of TMAH.

Figure 11:
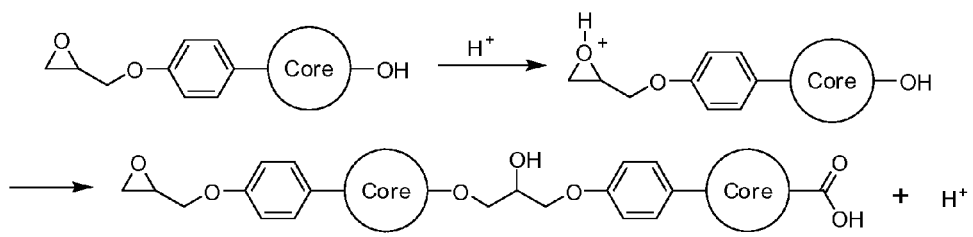
FIG. 11 schematically illustrates an intermolecular etherification between molecular glass resists.

One example of a photo-acid catalyzed etherification between functional groups of adjacent molecular glasses includes acid catalyzed epoxide ring opening by an alcohol. This type of reaction is schematically shown in FIG. 11. The resist molecules are blended with a PAG that generates a photo-acid or other initiator. The acid activates an epoxide or similar molecule such that it can react with alcohols and phenols on adjacent molecules to increase the molecular weight and/or reduce the hydrophilicity of the molecule, thereby rendering it less soluble in developer relative to the unexposed areas. Development can be carried out using solvents such as MIBK, PGMEA, or the like, or water or aqueous solutions of TMAH.

One example of a reaction between a photo-base and functional groups of adjacent molecular glasses to cross-link the adjacent molecular glasses includes cross-linking of epoxide groups of adjacent molecular glasses. Such a reaction is shown schematically in FIG. 12. The molecular glasses are blended with a PBG that generates a base upon exposure. The base reacts with multiple epoxides, cross-linking the molecular glasses. The increase in molecular weight of the resist renders it insoluble in developer relative to the unexposed areas. Development can be carried out using organic solvents such as MIBK, PGMEA, or the like, or in aqueous solutions.

Figure 12:
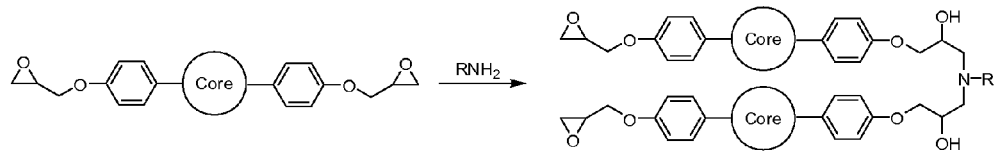
FIG. 12 schematically illustrates a reaction between a photo-base and functional groups of adjacent molecular glasses to cross-link the adjacent molecular glasses.
Figure 13:
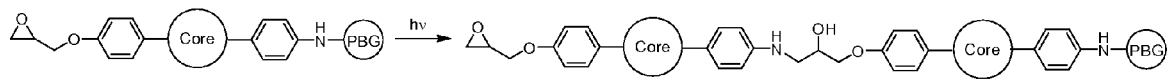
FIG. 13 schematically illustrates a reaction between a photo-base, which is formed from a photo-base generator that is bound to the molecular glass core, and functional groups of adjacent molecular glasses to cross-link the adjacent molecular glasses.

One example of a reaction between a photo-base (generated from a photo-base generator that comprises a portion of the molecular glass core of a molecular glass) and a functional group of an adjacent molecular glass to cross-link a molecular glass with the adjacent molecular glass is similar to that shown in FIG. 12, with the exception that the PBG is bound to the molecular glass core. This concept is shown in FIG. 13. The base can react with multiple epoxides, cross-linking the molecular glasses, but since the base is also attached to a molecular glass, the act of reacting with a single epoxide acts to cross-link multiple molecular glasses. The increase in molecular weight of the resist renders it insoluble in developer relative to the unexposed areas. Development can be carried out using organic solvents such as MIBK, PGMEA, or the like, or in aqueous solutions.

Figure 14:
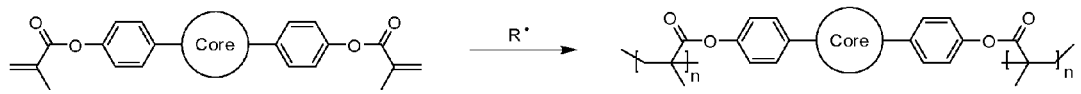
FIG. 14 schematically illustrates a free radical polymerization between molecular glass resists.

Examples of free radical catalyzed polymerization of the functional group of adjacent molecular glass molecules to cross-link adjacent molecular glass molecules can include a molecular glass that is functionalized with aryl alkenes, acrylates, or methacrylates. The resist molecules are blended with a photo-radical generator that generates a free radical. The free radical initiates the free radical polymerization of double bonds, thereby cross-linking the molecular glasses. The increase in molecular weight of the resist renders it insoluble in developer relative to the unexposed areas. Development can be carried out using organic solvents such as MIBK, PGMEA, or the like, or (in some cases) aqueous solutions of TMAH. FIG. 14 schematically illustrates this type of reaction using a methacrylate functional group.

The various embodiments of the present invention are illustrated by the following non-limiting examples.

EXAMPLES

Example 1

Influence of Solubility Switching Mechanism on Resist Performance in Molecular Glass Resists A variety of solubility switching mechanisms (i.e., decreasing the solubility of a molecular glass) have been proposed and used for molecular resists. These include positive tone chemically amplified compositions with several different types of protecting groups based on phenol deprotections and carboxylic acid deprotections. A few different negative tone materials have also been used, based on either epoxide ring opening, cross-linking, or hydroxyl cross-linking via an additional additive. Although many solubility switching mechanisms have been used, they have been investigated on many different molecular cores in such a way that no direct comparison of the advantages and disadvantages of each solubility switching scheme could be directly made on a common molecular core platform. In addition, it would appear that the majority of previous publications report only the positive aspects of their results, while not discussing in any detail the negative features and results from the materials investigated. This study compares different solubility switching mechanisms in molecular resists, all based on a common core molecule, revealing both the advantages and disadvantages of each mechanism.

The common core molecule used in this study is one of the smallest cores that will form amorphous glasses, 1,1,1-tris(4-hydroxyphenyl)ethane (THPE). In total, five different chemically amplified resists were formulated based on this common core. Three positive tone resists were made, one a high activation energy resist, 1,1,1-tris(4-tert-butoxycarbonyloxyphenyl)ethane (THPE-tBoc), and two low activation energy resists, 1,1,1-tris(4-tetrahydropyranyloxyphenyl)ethane (THPE-THP) and 1,1,1-tris(4-ethoxyethoxyphenyl)ethane (THPE-EE). One negative tone resist, tris(4-(oxiran-2-ylmethoxy)phenyl)methane (THPM-Ep), is based on epoxide ring opening cationic polymerization where the multi-functional core crosslinks. The other negative tone resist (THPE-CL) was made by blending the THPE core with both a photo-acid generator and an additional cross-linking agent, 1,3,4,6-tetrakis(methoxymethyl)glycoluril. This cross-linking agent reacts with the phenolic hydroxy functionality of THPE in the presence of acid to produce a crosslinked material. The structure of each of the cores is shown below.

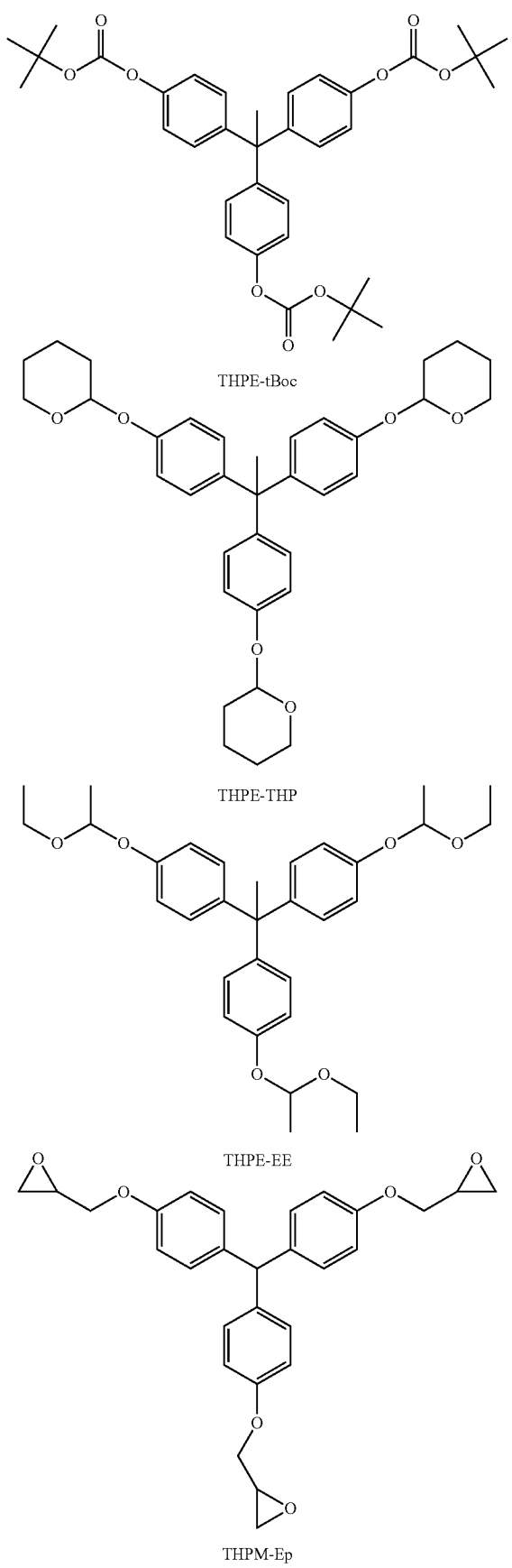

THPE-tBoc

THPE-THP

THPE-EE

THPM-Ep

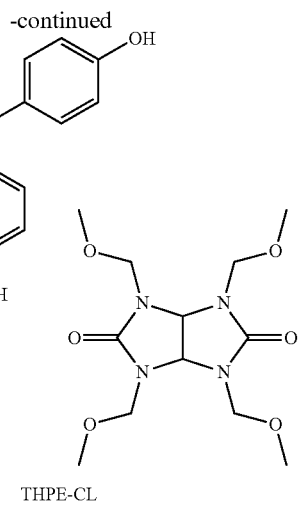

THPE-CL

Materials and Equipment.

THPE, 1,3,4,6-tetrakis(methoxymethyl)glycoluril, and 2,3-dihydropyran were purchased from TCI America. THPM-Ep, ethyl vinyl ether, and triphenylsulfonium nonaflate (TPS-Nf) were purchased from Sigma-Aldrich. TPS-SbF$_6$ was purchased from Midori Kagaku Co., Ltd. AZ300 tetramethylammonium hydroxide (TMAH) developer was donated by AZ Electronic Materials. THPE-tBoc was synthesized as previously reported in R. A. Lawson, C. Lee, R. Whetsell, W. Yueh, J. Roberts, L. Tolbert, and C. L. Henderson, Proc. SPIE. 6519, 65191N (2007). DUV contrast curves were made using Oriel Instruments 500 W Hg—Xe arc lamp with a 248 nm band-pass filter with film thicknesses measured using a M-2000 spectroscopic ellipsometer (J.A. Woolam, Inc.) over the wavelengths of 350 to 1000 nm using a Cauchy layer to model the resist film. E-beam lithography was done using a JEOL JBX-9300FS electron-beam lithography system with 100 keV acceleration voltage, 2 nA current, and 10 nm single-pixel shot pitch. Resolution tests were done on 75 nm thick films coated onto a 46 nm thick silicon nitride membrane windows.

Synthesis of 1,1,1-Tris(4-tetrahydropyranyloxyphenyl)ethane (THPE-THP).

2.53 g (8.26 mmol) of 1,1,1-tris(4-hydroxyphenyl)ethane was dissolved in 20 mL of ethyl acetate in a round bottom flask. 8 mL of 2,3-dihydropyran and 8 drops of trifluoroacetic acid were added to the mixture. After stirring overnight, a white precipitate had formed in the flask. This precipitate was collected by filtration and dissolved in 20 mL of dichloromethane to which was added 8 mL of 2,3-dihydropyran and 6 drops of trifluoroacetic acid. After stiffing for two days, 20 mL of 0.261 N TMAH was added; the organic phase was extracted, washed with water (20 mL) twice, and dried with MgSO$_4$. The solvent was removed in vacuo to yield 2.82 g of THPE-THP as a white powder. Yield: 77%. $^1$H-NMR (300 MHz, CDCl$_3$) δ (ppm) 1.5-2.0 (18H), 2.09 (3H), 3.60 (3H), 3.92 (3H), 5.37 (3H), 6.91 (6H), 6.98 (6H).

Synthesis of 1,1,1-Tris(4-ethoxyethoxyphenyl)ethane (THPE-EE).

THPE-EE was synthesized analogously using to THPE-THP using ethyl vinyl ether instead of dihydropyran. $^1$H-NMR (300 MHz, CDCl$_3$) δ (ppm) 1.21 (t, 9H), 1.48 (d, 9H), 3.55 (m, 3H), 3.80 (m, 3H), 5.35 (3H), 6.87 (6H), 6.98 (6H).

Resist Processing.

Due to the unique nature of each resist, they each received slightly different processing conditions as described below. THPE-tBoc and THPE-THP were dissolved in cyclohexanone along with 5 mole % TPS-Nf (with respect to the functionalized THPE solids), spin cast into films, and post apply baked at 90° C. for 2 minutes to form 100 nm thick films. Post exposure, these films received a post-exposure bake (PEB) at 90° C. for 60 seconds and were developed in 0.065N TMAH (¼ dilution of AZ300 MIF) for 30 seconds. THPE-EE was an oil at room temperature, and so no further lithographic testing was performed on that material. THPM-Ep was dissolved in PGMEA along with 5 mol % TPS-SbF$_6$ (with respect to the THPM-Ep solids), spin cast into films, and soft-baked at 60° C. for 4 minutes to form 120 nm thick films. The THPM-Ep films received a PEB at either 60° C. or 90° C. for 60 seconds and were developed in MIBK for 30 seconds followed by an isopropanol rinse. The THPE-CL resist was formulated by dissolving THPE into PGMEA along with 15 wt % (relative to THPE solids) of 1,3,4,6-tetrakis(methoxymethyl)glycoluril and 5 mol % (relative to THPE solids) TPS-Nf as a PAG. THPE-CL films were soft-baked at 90° C. for 2 minutes to form 100 nm thick films. The PEB for the THPE-CL films was 90 or 110° C. for 60 seconds, followed by development in 0.013N TMAH (1/20 dilution of AZ300 MIF) for 30 seconds. All solutions were filtered through 0.2 μm PTFE filters before use. No base quencher was used in these resist formulations so as to prevent any effect on LER and to eliminate any interaction or segregation effects of base with the various different resists.

THPE-tBoc.

THPE-tBoc behaves much like its polymeric analogue, tBoc protected poly(hydroxystyrene) (tBoc-PHOST). It was thermally stable to approximately 130-140° C., when the tBoc groups began to thermally deprotect, and it could be developed in 0.261N TMAH with no appreciable dark loss. It could be processed without addition of primer, but performed better in developer when HMDS was used to prime the silicon substrate before coating. It exhibited film thickness loss in the exposed areas during PEB of upwards of 50% of the total thickness due to volatilization of the tBoc deprotection products.

The imaging performance of THPE-tBoc under DUV exposure was rather good. Its sensitivity was approximately 8 mJ/cm$^2$, depending on development conditions. The contrast was also good in 0.261N TMAH, at approximately 8.5, but could be improved even further to 11 by using a more dilute developer of 0.065N TMAH. Under electron beam exposure, THPE-tBoc showed much poorer behavior. The contrast was reduced to 1.4 and the dose-to-clear was an unexpectedly high 153 μC/cm$^2$. For high resolution imaging under e-beam, no features of 100 nm or smaller could be imaged due to high levels of photo-acid diffusion which blurred out smaller features. Although a PEB of 90° C. is not extremely high, photo-acid diffusion is a major issue in this resist because of the high concentration of acid required to image (as judged by the dose). It is also likely that the high level of protection of the resist contributes to the reduced sensitivity under e-beam.

THPE-THP and THPE-EE.

THPE-THP had several problems. It did not consistently form good films, even when HMDS was used to prime the silicon substrate surface. Since adhesion was poor, when the developed film was rinsed in water after exposure, large sections of the unexposed resist would lift off of the substrate. The most significant problem however with the use of THP as a protecting group for a resist molecule as small as THPE is that the number of protecting groups per core molecule is large, i.e. a 3:1 molar ratio in this case. The high level of THP protection is a serious problem because the dihydropyran and other deprotection products are insoluble in developer and even more significantly, the dihydropyran tends to polymerize in the presence of photo-acid to form insoluble polymer films.

In an attempt to circumvent some of the problems with the dihydropyran deprotection product of THPE-THP, THPE-EE was synthesized with the intention that the deprotection product could more easily be volatilized and would not be as reactive toward polymerization as the dihydropyran produced from the THPE-THP. Unfortunately, synthesis of the THPE-EE showed that it was an oil at room temperature. This is likely due to the presence of the flexible ether linkages in the protecting group. THPE-THP is a solid because the cyclic structure of the protecting group reduces the flexibility in the molecule relative to THPE-EE. Therefore, no further processing of the THPE-EE was attempted.

THPE-CL.

THPE-CL had several problems even before high resolution imaging was attempted. One problem is that for a PEB of 90° C. or less, very dilute developer (<0.026N) must be used. This is because the THPE-CL still forms a phenolic, hydroxy terminated, low molecular weight polymer that can dissolve in sufficiently strong aqueous alkaline developers even though some crosslinking occurs. Another problem was that for a PEB of 90° C., the developed film at maximum dose and thickness was only approximately 50% as thick as the original film. This puts the lower temperature limit for PEB processing of the THPE-CL material at 90° C. or above, which prevents the use of low temperature PEB processing that could be used to help overcome photo-acid diffusion blurring.

Under DUV exposures, THPE-CL did exhibit a very high sensitivity. The $D_{50}$ (dose to obtain 50% of maximum film thickness) for THPE-CL was on the order of 1 mJ/cm$^2$. However, the contrast ratio was a disappointingly low value of approximately 2 for a 90° C. PEB. Under e-beam exposure, the high sensitivity was maintained, with a $D_{50}$ of 28 μC/cm$^2$ at an acceleration voltage of 100 keV. However, high resolution testing of THPE-CL using e-beam exposures revealed even more problems. For PEB temperatures less than 110° C., all small patterns produced using e-beam patterning washed off of the substrate. Furthermore, even at the lowest PEB temperature to successfully produce viable patterns of 110° C. and at the low exposure doses (approximately at the $D_{50}$ dose), photo-acid diffusion induced pattern blur was a significant problem. No sub-100 nm patterns could be resolved, even for relaxed 1:3 pattern spacings. Any future use of THPE-CL would require significant base quencher loading and photo-acid diffusion control to obtain reasonable imaging control, and the use of extremely dilute developers can be problematic due to problems in controlling and maintaining a constant developer strength.

THPM-Ep.

THPM-Ep had to be pre-apply baked at 60° C. or less, because at higher temperatures the film dewets from the silicon substrate forming defects in the film. This occurs because the terminating glycidyl ethers on THPM-Ep are so flexible that they significantly lower the melting point as compared to the unprotected compound. After exposure, the film could be post-exposure baked at temperatures higher than 60° C. because the cross-linked film was much more robust. One disadvantage of using the cationic ring opening of glycidyl epoxides as a solubility changing mechanism is that this greatly limits the choice of PAGs that can be used in formulating the chemically amplified resist. Only non-nucleophilic acid counter-ions can be used; sulfonic acids, including perfluorinated sulfonic acids, will not effectively cause polymerization. Unfortunately, most non-nucleophilic acids such as hexafluoroantimonate are unfavorable for use in semiconductors applications for a variety of reasons.

Despite these drawbacks, THPM-Ep has many good properties. Unlike positive tone resists, it exhibited no change in film thickness or shrinkage upon PEB. Multiple different solvents can be used for development including MIBK, THF, and PGMEA. Choice of developer could have an effect on LER due to differences in swelling and pattern collapse, but was not investigated in this study; MIBK was used as developer for all results shown for THPM-Ep. However, use of a solvent for development is generally considered less favorable for semiconductor processing as compared to aqueous based developers. THPM-Ep imaged under DUV with good sensitivity, reaching around 75% of its maximum thickness at an exposure dose of only 3 mJ/cm$^2$. It also had reasonable contrast, with a contrast ratio of approximately 5. FIG. 17 shows DUV and e-beam contrast curves for THPM-Ep for different PEB conditions. In e-beam, THPM-Ep still shows excellent sensitivity with a $D_{50}$ of 16 µC/cm$^2$. Interestingly, there appears to be a potentially more favorable imaging dose of approximately 6-8 µC/cm$^2$, which gives only 33% of the maximum film thickness but at the highest contrast of approximately 2.5. It can be seen that PEB temperatures from 60-90° C. can be used with little loss in performance, the only major differences being that at 90° C. the final film thickness is the same as before development, while at 60° C., there is still around 20% dark loss even at high doses.

THPM-Ep showed excellent high resolution imaging. FIG. 18 shows 80 nm 1:1 line/space patterns for THPM-Ep with a PEB of 60° C. (THPM-Ep-60), and 50 nm 1:1 line/space and 30 nm 1:3 line/space patterns for THPM-Ep with a PEB of 90° C. (THPM-Ep-90). THPM-Ep-90 resolved 1:1 patterns down to 50 nm and 1:3 patterns down to 30 nm, while THPM-Ep-60 gave excellent 1:1 patterns down to 55 nm and 1:3 patterns down to 40 nm. Failure at smaller pitch sizes was not due to image blurring, but was instead due simply to pattern collapse as the aspect ratio of features increased due to the pattern size decreasing at constant film thickness. It is believed that THPM-Ep-90 gave smaller features than THPM-Ep-60 because of the more complete cross-linking which occurs at the higher PEB temperature, thus generating more robust features. No major difference between the two PEB conditions due to photo-acid diffusion could be easily observed, but was likely due to lack of any identical comparable lines smaller than 40 nm.

Using the 80 nm 1:1 line/space patterns, the LER and line-width-roughness (LWR) were calculated. For THPM-Ep-60, LER (3σ) was 2.7 nm and LWR (3σ) was 3.8 nm, while for THPM-Ep-90, an even smaller LER (3σ) of 2.3 nm and LWR (3σ) of 3.4 nm were obtained. These are very low values for LER, much lower than the 5 nm minimum that is commonly reported for conventional CARs. This 5 nm limit appears to hold true for both polymeric and molecular glass resists. The excellent LER performance of this resist can likely be attributed to several things. The film should be very uniform in that each individual resist molecule in the initial film is identical, and so development should be very uniform. The high sensitivity implies that there is very little photo-acid actually generated at the imaging doses for this material, and thus the driving force for photo-acid diffusion at the line edge is lower. The photo-acid counter-ion in this system is also quite bulky and should help to limit photo-acid diffusion. The cross-linking reaction can occur without the movement of the proton, meaning that the solubility switching is not dependent on the photo-acid diffusing to each individual reaction site.

Conclusion.

Five different molecular glass CARs were investigated based on a common molecular resist core. THPE-THP was found to form insoluble residues after exposure, and so was not tested in e-beam for high resolution imaging. THPE-EE was an oil at room temperature, but the EE protecting group could possibly work as a low activation energy protecting group on larger molecular resist cores. THPE-tBoc imaged with reasonable contrast and could be processed under similar conditions as tBoc-PHOST, but the fully protected glass required high levels of photo-acid to cause deprotection which resulted in photo-acid diffusion induced pattern blur. Although this specific resist could not resolve sub-100 nm images due to photo-acid diffusion induced blur, it appeared that it could be optimized and redesigned for improved imaging. However, sub-50 nm imaging for the THPE-tBoc material is doubtful at any reasonable sensitivity. The THPE-tBoc material did however show that the tBoc protecting group does not increase the flexibility of even small core molecules to the point where the glass transition or melting point is lowered to levels where the behavior of the compound suffers. THPE-CL had good sensitivity, but suffered because of the high temperatures required for imaging which led to blurred images. Even though the use of base quencher and diffusion control could likely improve resolution, the high temperatures required for imaging likely would severely limit the ultimate resolution of this material. THPM-Ep had good sensitivity with reasonable contrast and produced excellent high resolution patterns with a low LER (3σ) of 2.3 nm. Its basic imaging shows that it is a good candidate for further study for the 32 nm node and below; indeed, it has already shown the capability to resolve 30 nm lines at 1:3 line/spacing. Its industrial application in semiconductor processing may be limited though due to both the limited choice of PAGs that work with this material (i.e. sulfonic acid PAGs cannot be used and instead this material required non-nucleophilic PAGs such as triphenyl sulphonium hexafluoroantimonate) and the requirement that organic solvents be used for development. However, because of its excellent imaging with high sensitivity at 100 keV, THPM-Ep should receive further consideration as a resist for future high resolution e-beam lithography applications including mask making.

Example 2

Epoxide Functionalized Molecular Resists for High Resolution Electron Beam Lithography Most electron beam resists used today are non-chemically amplified systems, such as PMMA, ZEP, and HSQ, that allow for very high resolution, but at the cost of low sensitivity. This means that the write times for many patterns are very long and costly. A much more sensitive chemically amplified resist (CAR) would be preferred to reduce write time, but conventional CARs have not been widely used because they have limited resolution due to photo-acid diffusion and poor line edge roughness (LER). LER is particularly a problem for resists used in photomask and imprint template making because LER in the mask or template can be transferred to the resist. As feature sizes shrink using optical lithography, the aerial image LER becomes larger relative to the actual LER on the mask due to the so-called mask error enhancement factor (MEEF), and thus the amount of LER transferred from the mask to the resist and ultimately the substrate also increases.

One possible solution to the reducing the LER problem in CARs is to use molecular photoresists. Molecular resists provide improved LER compared to conventional polymeric CARs, but their small sizes and possible low glass transition temperatures ($T_g$) may also lead to problems, such as increased photo-acid diffusion and reduced mechanical strength and integrity compared to polymeric resists. One solution is to use a molecular resist that forms a cross-linked polymer network upon exposure. This maintains the advantage of molecular resists in terms of pixel size, homogeneity, and dissolution behavior, but it benefits from the increased $T_g$ and mechanical strength of polymers.

Cationic polymerization and cross-linking of epoxide functionalized polymer resists have been used for several years in both electron beam and deep-UV (DUV) applications, most notably in the now common SU-8 photoresist. Several different types of epoxide functionalized molecular resists, primarily calixarenes, have also been recently reported. Some of these resists have resolved sub-50 nm patterns in a chemically amplified modes with good sensitivity, but little or no report was made on the LER of the resolved features. As illustrated in Example 1, 1,1,1-tris(4-hydroxyphenyl)methane triglycidyl ether (3-Ep) was shown to be able to resolve 50 nm half pitch features with an extremely low LER (3σ) of 2.3 nm with a sensitivity of 20 µC/cm². Despite the excellent performance of 3-Ep, the molecular resist suffered from poor adhesion and a low melting point (<60° C.) that affected the film quality during the post-apply bake (PAB) due to dewetting and limited the PAB to a maximum temperature of 60° C. The purpose of the following experiments was to identify other epoxide functionalized molecular resist compounds that could resolve these problems observed with the 3-Ep resist while maintaining or improving upon its lithographic performance. One compound that was explored as a possible improvement upon the 3-Ep compound is 1,1,2,2-tetra(4-hydroxyphenyl)ethane tetraglycidyl ether (4-Ep). 4-Ep was chosen as a possible improvement to 3-Ep since its larger molecular weight should provide improved thermophysical properties and allow for higher PAB temperatures. The chemical structure of 3-Ep and 4-Ep are shown below.

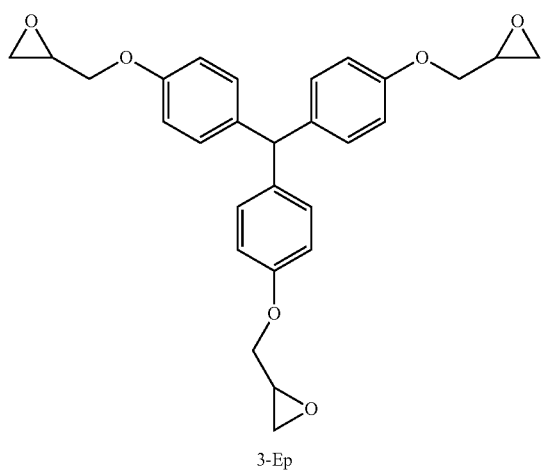

3-Ep

-continued

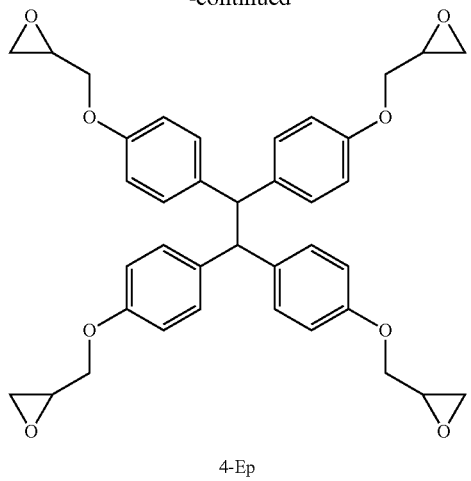

4-Ep

Materials and Methods.

3-Ep, 4-Ep, propylene glycol monomethyl ether acetate (PGMEA), and methyl isobutyl ketone (MIBK) were purchased from Sigma-Aldrich. Triphenylsulfonium hexafluoroantimonate (TPS-SbF$_6$) was purchased from Midori Kagaku Co., Ltd. E-beam lithography was done using a JEOL JBX-9300FS electron-beam lithography system with 100 keV acceleration voltage, 2 nA current, and 10 nm single-pixel shot pitch. Resolution tests were done on resist films coated onto 46 nm thick silicon nitride membrane windows. SEM analysis was done with a Zeiss SEM Ultra60.

Resists solutions were made by dissolving the Ep molecular resist compound along with 5 mol % (with respect to the Ep compound) TPS-SbF$_6$ PAG into PGMEA. No base quencher was added in these formulations. The resists were spin coated and post-apply baked (PAB) at 90° C. to a film thickness of 120 nm for contrast curves and 80 nm for resolution testing. The remaining film thickness post-development was normalized to the initial film thickness to generate the contrast curves. The resists were post-exposure baked (PEB) at 90° C., followed by 30 second development in MIBK with an isopropyl alcohol final rinse.

4-Ep.

Figure 19:
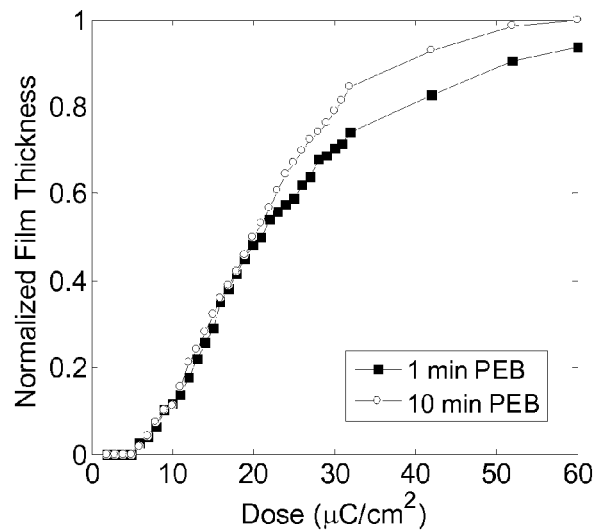
FIG. 19 shows electron beam (100 keV) contrast curves for 4-Ep at two different 90° C. PEB times.

The larger size of 4-Ep compared to 3-Ep allowed for a PAB of 90° C. with no effect on film quality. The e-beam contrast curve for 4-Ep with a PEB at 90° C. for 1 minute and 10 minutes is shown in FIG. 19. The resist is quite sensitive, and the sensitivity has almost no dependence on the length of the PEB, with the dose to 50% normalized film thickness at 22 µC/cm² for the 1 minute PEB and 21 µC/cm² for a PEB of 10 minutes. PEB time also had minimal effect on the contrast ratio (γ); γ was 1.9 for the 1 minute PEB and γ was 2.0 for the 10 minute PEB. This relative insensitivity to bake condition is somewhat expected as the resist begins to crosslink as soon as it is exposed, and thus a significant amount of the total crosslinking that will occur in the resist can happen while the sample is still at ambient temperature in the e-beam under vacuum. It is likely that one only sees deviations in the contrast curve as a function of bake condition at high doses and longer bake times because it is only under these cases where any significant amount of crosslinking occurs beyond what occurred in the e-beam tool. The contrast behavior for 4-Ep was very similar to that of 3-Ep.

Figure 20:
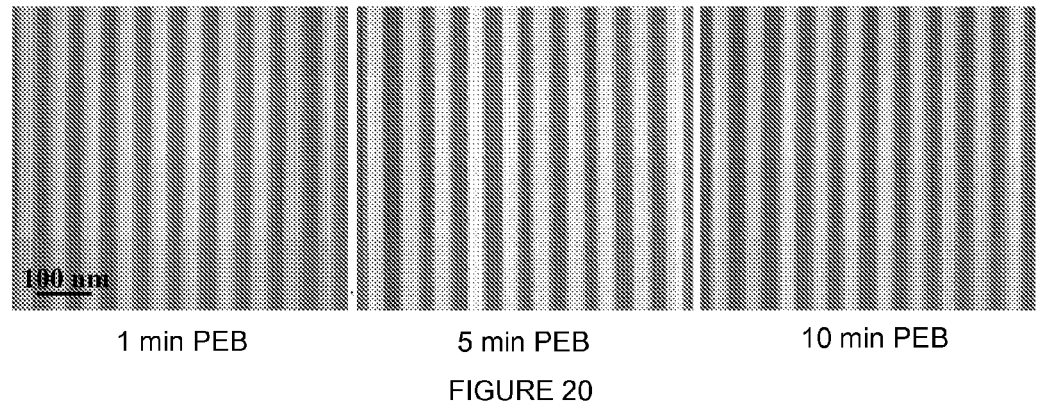
FIG. 20 includes SEM images of 4-Ep demonstrating 35 nm half-pitch resolution at 50 µC/cm² for three different PEB times at 90° C.

Three different PEB times at 90° C. were used to compare the effect of bake time on resolution and imaging performance: 1 minute, 5 minutes, and 10 minutes. Performance was virtually identical for each bake time. The resist was able to resolve 1:1 line-space patterns down to 35 nm half-pitch at a dose of 50 µC/cm² for all three bake conditions. FIG. 20 shows SEM images of the 35 nm 1:1 line-space features. Overall, the effect of bake time had little effect on the resist performance both from line-to-line on a sample and from sample-to-sample. The maximum standard deviation in critical dimension (CD) from line-to-line on each sample was 0.9 nm, and the maximum difference in average line width from sample-to-sample was 0.5 nm.

The high resolution observed in this chemically amplified system can be attributed to several possible causes. The rapid, heavy cross-linking in this system in the exposed regions while still at low temperature in the e-beam chamber should quickly limit photo-acid diffusion in the film during the post-exposure bake, and thus any blurring of the image due to photo-acid diffusion should be minimal. The photo-acid counter-ion in this system ($SbF_6^-$) is also relatively heavy and large which should help to further limit any photo-acid diffusion.

Some features smaller than 35 nm were resolved, but they began to suffer from line widening; the developed lines were wider than the nominally patterned feature. The line widening could either be due to acid diffusion or due to lateral propagation of the polymerization beyond the line-edge, or a combination of the two. Either problem could likely be improved by using different processing conditions such as a PEB at a lower temperature, imaging at lower doses, or addition of a base quencher. If spatial propagation of the polymerization serves to blur the image, it must be at very small length scales (i.e. <~10 nm blur based on the beam spot size in these tests and the ~30 nm feature size where line widening is observed as feature size is reduced). There appeared to be no major occurrence of pattern collapse for an 80 nm thick film, meaning that this resist could obtain an aspect ratio of about 2.5:1 for 1:1 line/space patterns. This is not unexpected, and it could probably resolve even higher aspect ratio features since polymeric phenolic epoxide resists, such as SU-8, are well known to resolve high aspect features, and the cross-linked molecular resists should be structurally similar to the crosslinked polymeric resists.

Figure 21:
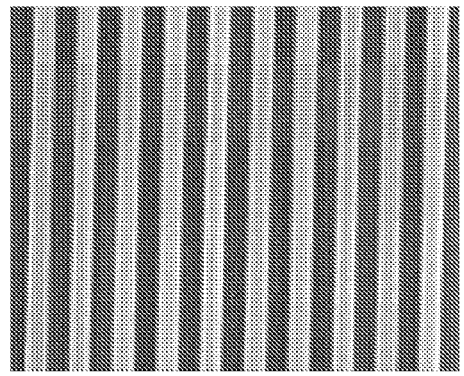
FIG. 21 includes an SEM image of 4-Ep illustrating the low LER (3σ) of 2.3 nm for 70 nm half-pitch lines at 50 µC/cm².

The line edge roughness of the resist was determined using 70 nm half-pitch lines with an inspection length of 1 µm. FIG. 21 shows an example of the SEM image of 70 nm lines used for this analysis. The LER (3σ) was 2.3 nm and LWR (3σ) was 3.2 nm for each of the different bake times. These are as small as any LER values reported for a photoresist and are the same values previously obtained for 3-Ep, indicating that the 4-Ep system preserves the imaging performance of 3-Ep, while offering improved thermal stability. The excellent LER is likely due to the low swelling of the molecular resist and the small acid diffusion length.

An epoxide functionalized molecular resist (4-Ep) was found to simultaneously have excellent resolution (≤35 nm half-pitch), high sensitivity (~20 µC/cm²), and extremely low LER (2.3 nm 3σ). This performance was for an unoptimized system with no base quencher. Future process improvements can likely improve the performance even further. Epoxide functionalized molecular resists show great promise for photoresist applications that demand a combination of resolution, sensitivity, and LER.

Example 3

High Resolution Negative Tone Molecular Resist Based on Di-Functional Epoxide Polymerization For both extreme ultraviolet (EUV) and e-beam lithography, it is desired that resists combine good resolution, sensitivity, and line-edge roughness. Non-chemically amplified resists (non-CARs), such as PMMA, ZEP, and HSQ, generally have the advantage of high resolution and good line-edge and line-width roughness (LER and LWR), but at the cost of very poor sensitivity which leads to high exposure doses and low exposure tool throughputs. The poor sensitivity generally makes them unsuitable for EUV lithography and limits their usefulness in many e-beam applications. Chemically amplified resists (CARs) replaced non-CARs as the workhorse material for high resolution optical patterning because their significantly better sensitivity and contrast allows for much higher throughputs and excellent pattern profiles under the degraded optical aerial images resulting from continued extension of optical lithography. However, CARs have shown more limited success in sub-50 nm patterning due to their typically higher LER and poorer ultimate resolution. The ultimate resolution of such materials is limited primarily due to photo-acid diffusion, where the acid generated during exposure diffuses outside of the patterned area during post-exposure bake (PEB), blurring the final resist image. In order to successfully implement a chemically amplified resist for EUV or e-beam lithography, it must be designed such that it has improved resolution and reduced LER as compared to current materials.

Photo-acid diffusion can be controlled through a number of ways including covalently binding the photo-acid to the polymer to reduce the diffusion coefficient of the photo-acid or by blending in base quencher which helps reduce diffusion beyond the line-edge by neutralizing the photo-acid escaping into unexposed regions. Both of these approaches have been used successfully to improve the resolution of CARs, but they both come with the cost of reduced sensitivity for the same number of generated photo-acids. Another approach that has not been as extensively studied for high resolution resists is the use of cationic polymerization, such as epoxide polymerization, to achieve solubility switching in the resist rather than the acid-catalyzed deprotection of blocking groups. Solubility switching based on polymerization offers many potential advantages in terms of resist performance, including potential resolution improvements due to the different imaging mechanism as discussed later. Perhaps the common example of an epoxide based cross-linking resist is SU-8, a negative tone resist commonly used in microelectronic and MEMs fabrication. Patterning of high resolution line features in SU-8 has been previously reported at resolutions down to 24 nm, but none of the reports of such high resolution features have achieved these results in dense patterns. Initial studies of high resolution patterning of SU-8 in dense features in our group indicate that resist swelling may be a controlling factor for dense feature patterning.

Molecular glass photoresists were originally introduced because it was thought that the effective reduction in resist molecule pixel size would improve LER. Additionally, molecular resists offer other advantages because their synthesis and purification can be precisely controlled to create a mono-disperse resist with well-defined structure and properties. Using the approach of epoxide functionalized molecular resists to combine the advantages of molecular resists with the potential advantages of cationic polymerization, we have recently reported on the design and characterization of two negative tone CARs (referred to as 3-Ep and 4-Ep). 3-Ep is a tri-functional epoxide resist that has shown 30 nm resolution, a sensitivity of 20 µC/cm², and 2.3 nm LER (3σ). 4-Ep is a tetra-functional epoxide resist that has shown 35 nm 1:1 half-pitch (hp) resolution, a sensitivity of 22 µC/cm², and 2.3 nm LER (3σ). In this Example, 9,9-bis(4-hydroxyphenyl) fluorene diglycidyl ether (2-Ep) is a di-functional epoxide resist that has been synthesized in order to attempt to further improve the resolution of this class of materials. The chemical structure of 2-Ep is shown below.

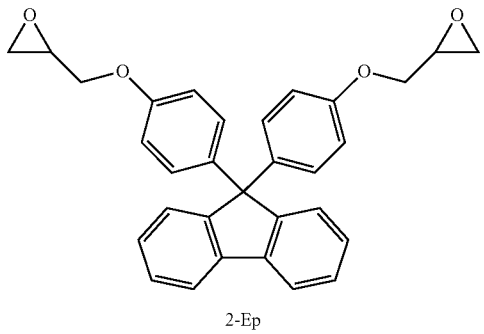 [SMILES: c1ccc2c(c1)-c1ccccc1C2(c1ccc(OCC2CO2)cc1)c1ccc(OCC2CO2)cc1]

2-Ep

Materials and Methods.

2-Ep was synthesized by functionalizing 9,9-bis(4-hydroxyphenyl)fluorene with epichlorohydrin in the presence of NaOH with heating. Triphenylsulfonium hexafluoroantimonate (TPS-SbF$_6$) photo-acid generator (PAG) was purchased from Midori Kagaku Co., Ltd. All other reagents and solvents were obtained from Sigma-Aldrich or TCI America. E-beam lithography was done using a JEOL JBX-9300FS electron-beam lithography system with 100 keV acceleration voltage, 2 nA current, and 10 nm single-pixel shot pitch. E-beam contrast curves were made on silicon, and the remaining thickness measured using a KLA-Tencor P15 Profilometer. Resolution tests were done on resist films coated onto 46 nm thick silicon nitride membrane windows. The patterns produced by e-beam lithography were imaged using a LEO 1530 thermally assisted field emission SEM with 3 keV acceleration voltage. Critical dimension (CD) measurements, and the whole spatial-frequency 3σLER and 3σLWR spectra of the resist pattern were averaged from 10 different line-space patterns using an inspection length of 1 micron.

Resist solutions were made by dissolving 2-Ep and 5.0 mole percent (relative to 2-Ep) triphenylsulfonium hexafluoroantimonate into propylene glycol monomethyl ether acetate (PGMEA) and filtering the solution through 0.2 μm PTFE filters. After spin-coating, the films were post-apply baked (PAB) at 90° C. for 120 seconds. The exposed films were post-exposure baked at 60° C., 90° C., or 110° C. for 60 seconds. Development was carried out using puddle development in methyl isobutyl ketone (MIBK) for 30 seconds followed by an isopropanol rinse. No base quencher or any other additive was used for the resist imaging.

2-Ep.

E-beam (100 keV) contrast curves were made for 2-Ep and are shown in FIG. 22 for a 60 second PEB of 90° C. and 110° C. The lower dose region (up to around 60% remaining film thickness) looks identical for both PEB temperatures, and the sensitivity is 38 μC/cm$^2$ at 50% remaining film thickness. The higher dose regions differ more, with the 90° C. PEB curve reaching a limiting value of 75% remaining film thickness while the 110° C. curve eventually approaches 100% remaining film thickness. If the PEB temperature is 60° C., a limiting value of only 25% remaining film thickness was found under DUV exposure (not shown). The different final film thicknesses are most likely due to the fact that the higher PEB temperatures allow for more complete cross-linking. The contrast is 1.4 for a PEB of 110° C. and 1.3 for a PEB of 90° C. Although these are relatively small values for contrast as compared to positive tone CARs that can have contrast values on the order of 10 and larger, the 2-Ep contrast is in the range more typical of other negative tone high resolution resists like HSQ.

High resolution 100 keV e-beam images are shown in FIGS. 23 A-D for a number of line widths with a 90° C. PEB. The linewidth along with the line/space pattern is shown on the image. The dose-to-size for all the patterns shown is 125 μC/cm$^2$. The film thickness for these patterns is around 50-60 nm. All patterns printed at the desired size down to 25 nm half-pitch. Smaller patterns, which were nominally 20 nm, printed at approximately 22-25 nm in size. The 20 nm 1:1 line/space failed due to pattern collapse at the attempted film thickness of 50-55 nm (aspect ratio >2:1) which is why 20 nm 1:2 line/space patterns are shown; parts of some the 25 nm hp lines can be seen to bend due to the fact that they are at a critical aspect ratio, although they obviously resolve. Despite the bending of some 25 nm lines, 2-Ep very clearly is capable of resolving 25 nm hp, and future work can possibly improve that until it is capable of achieving patterning resolutions on the order of 20 nm.

High resolution 35 nm hp e-beam patterning of 2-Ep for a PEB of 110° C. instead of 90° C. is shown in FIG. 23D. It can be seen that lines resolve at the correct size, but exhibit an unusual oscillatory appearance. Larger line/space patterns show similar oscillations and smaller patterns also resolve, although the size of the oscillations is greater in the smaller features. It is possible that differences in stress formation and relief during baking or slight swelling differences in the two processes are responsible for this phenomena.

The LER and LWR of 2-Ep for a PEB of 90° C. was determined. For 50 nm hp lines, the LER (3σ) was 2.8 nm and LWR (3σ) was 4.0 nm. For 30 nm hp lines, the LER (3σ) was 2.9 nm and LWR (3σ) was 4.2 nm. This is a small value for LER and an improvement compared to most conventional resists which exhibit LER in the range of 4-6 nm.

The superior resolution in this material relative to most conventional CARs is likely due to the fact that it uses cationic polymerization as a resist solubility changing mechanism. The resist resolution should be controlled by the propagation of polymerization front rather than photo-acid diffusion and the propagation of the deprotection reaction front as is common in current positive tone CARs. Since the polymerization ionic active site will be on an increasingly larger chain/network as the reaction proceeds, the rate of propagation will rapidly reduce in the glass as the chain grows larger to act as a self-regulating process to some degree. The rate of propagation locally could also be reduced due to the fact that the glass transition temperature of the resist locally in the vicinity of the polymerization should increase as the degree of cross-linking increases which can have an impact on the kinetics of the reaction and the mobility of the film.

Comparing the performance of 2-Ep presented here to the previously reported 3-Ep and 4-Ep compounds under identical formulation and processing conditions (5 mol % TPS-SbF$_6$ PAG, PEB of 90° C. for 1 min, development in MIBK), 2-Ep shows improved resolution and reduced sensitivity. The improved resolution may be due to a reduced mobility of the active cation during cross-linking for 2-Ep relative to 3-Ep and 4-Ep as a result of the higher glass transition temperature in the 2-Ep glass. A reduced mobility would also explain the reduced sensitivity of 2-Ep because more polymer chains must be initiated through photo-acids to obtain an equivalent level of cross-linking to 3-Ep and 4-Ep. Additional factors such as differences in extent of swelling, different chain lengths in the final network structure, different kinetics of polymerization, and other factors may also contribute to the observed behavior.

Conclusion.

An epoxide functionalized molecular resist (2-Ep) was designed, synthesized, and characterized. It was found to simultaneously exhibit excellent resolution (<25 nm half-pitch), good sensitivity (38 µC/cm$^2$ at 100 keV e-beam), and low LER and LWR (2.9 nm and 4.2 nm for 30 nm half-pitch). This specific compound and this class of materials have exhibited a good combination of resolution, sensitivity, and LER. It is a good candidate for future high resolution e-beam applications, such as mask making or imprint template fabrication due to its high sensitivity and good environmental stability, and it holds promise as a resist technology that can potentially address needs for future EUVL patterning challenges at the 22 nm node of ITRS roadmap.

Example 4

Negative-Tone Molecular Resists Based on Cationic Polymerization

For both extreme ultraviolet (EUV) and e-beam lithography, it is desired that resists combine good resolution, sensitivity, and line-edge roughness. While many non-chemically amplified resists (non-CARs), such as PMMA, ZEP, and HSQ have been used for very high resolution patterning in e-beam, their very poor sensitivity makes them much less favorable for high volume production resists because it leads to high exposure doses and low exposure tool throughputs. The poor sensitivity especially makes them unsuitable for EUV lithography and also has limited their usefulness in many e-beam applications. Chemically amplified resists (CARs) replaced non-CARs as the workhorse material for high resolution optical patterning because they have much higher throughputs due to their high sensitivities and excellent pattern profiles due to their high contrast under the degraded optical aerial images produced by projection lithography tools. In particular, positive tone chemically amplified photoresists based on acid catalyzed deprotection of protected polymeric resins have been the most widely investigated materials for high sensitivity, high resolution patterning. Unfortunately for sub-50 nm patterning, such CARs have had more limited success due to their typically higher LER and poorer ultimate resolution as compared to the non-CARs mentioned earlier. The ultimate resolution of such positive tone CAR materials is limited primarily due to photo-acid diffusion, where the acid generated during exposure diffuses outside of the patterned area during the post-exposure bake (PEB) process required to satisfactorily image the resist, thus blurring the final resist image. In order to successfully implement a chemically amplified resist for EUV or e-beam lithography, it must be designed such that it has improved resolution and reduced LER as compared to current materials.

A number of methods have been developed to control photo-acid diffusion. The most common approach has been to blend in base quencher into the resist which helps reduce diffusion by neutralizing photo-acids escaping from the exposed regions into unexposed regions. Of course, this success in controlling photo-acid diffusion comes at the expense of some loss in sensitivity of the resist due to the neutralization of some photo-acid in the exposed regions as well. More recently, the covalent binding of the photo-acid cation into the resist polymer resin has also been shown to be effective at reducing the diffusion coefficient of the photo-acid and providing improved LER and resolution in CAR systems. Even in the case of these polymer-bound PAG resists, some loss in sensitivity is generally observed and the resist polymers become an even more complicated copolymer to produce with any degree of accurate compositional control. An approach that has seen little investigation as a method to obtain high resolution chemically amplified resists is the use of cationic polymerization, such as epoxide polymerization, to achieve solubility switching in the resist rather than the common acid-catalyzed deprotection of blocking groups used in virtually all positive tone resists.

Cationic polymerization as an imaging mechanism provides several potential advantages over acid catalyzed deprotection based mechanisms. The negative tone resists should have superior mechanical strength compared to conventional resists because their imaging mechanism creates by design high MW highly cross-linked structures. This is especially important since pattern collapse is becoming a more significant issue as feature sizes shrink sub-50 nm. Such negative tone, polymerization-based resists also potentially offer an additional benefit towards high resolution patterning due to a form of diffusion control that is intrinsic to the resist design. The active species or active site in most deprotection based CARs is a photo-acid which is typically a small molecule that can diffuse outside the exposed region, blurring the image, and leading to a loss of resolution. In cationic polymerization resists, the photo-acid is only active for a single event, the protonation of an epoxide. After the epoxide is protonated and polymerization initiates, the active site is the cationic polymerization center which is always attached to the end of the growing chain. Since the active site is attached to the end of a rapidly growing chain or network, its diffusion length is automatically controlled and decreases rapidly as the polymerization proceeds. Finally, another potential advantage of these types of resists is that the cationic polymerization is a zero mass loss process. This should lead to very low or negligible levels of outgassing. Since outgassing is a growing concern for next generation lithography approaches that will likely require high vacuum exposure systems, negative tone materials should have superior outgassing as compared to conventional resists which produce smaller, more volatile products from the deprotection reaction.

Molecular glass photoresists were originally introduced because it was thought that the effective reduction in resist molecule pixel size would improve LER. Additionally, molecular resists are attractive because they possess other advantages such as the fact that their synthesis and purification can be precisely controlled to create a mono-disperse resist with well-defined structure and properties. The purpose of the following experiments was to investigate the advantages of combining a molecular resist approach with a negative tone cationic epoxide polymerization mechanism. To probe this issue, a series of three negative tone epoxide functionalized molecular resists have been designed, synthesized, and characterized. The resist structures made and studied in this work are shown in below along with SU-8, a popular commercially available epoxide functionalized oligomeric resist that was studied for comparison.

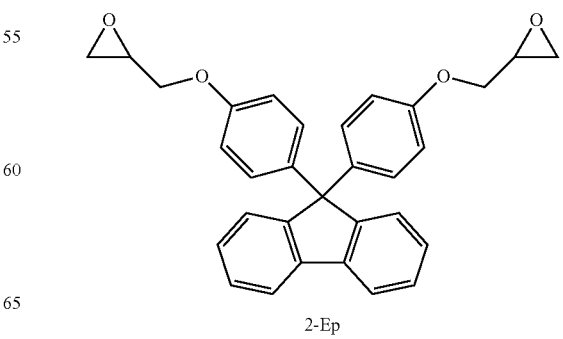

2-Ep

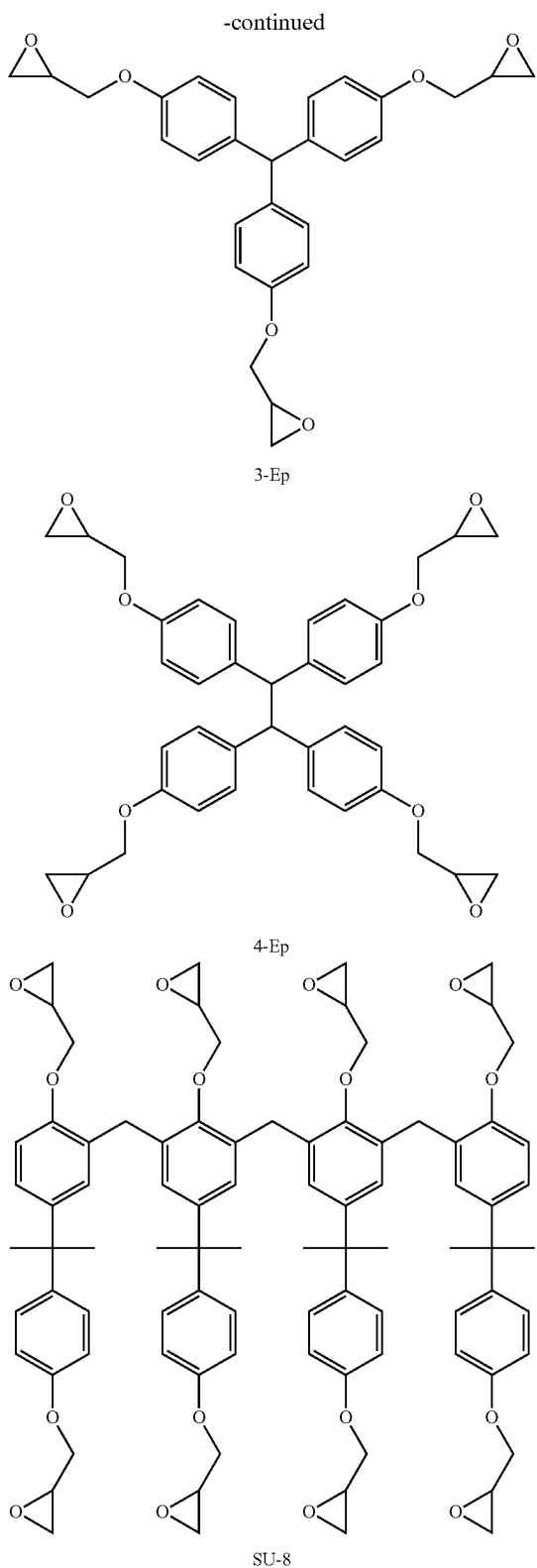

3-Ep

4-Ep

SU-8

Materials and Methods.

SU-8 2000 was obtained from MicroChem Corp. and diluted using PGMEA to obtain thin films of 60-70 nm in thickness. Details about synthesis of 2-Ep, 3-Ep, and 4-Ep are discussed in the above Examples. Molecular resist solutions were made by dissolving the resist in PGMEA along with 5 mol % triphenylsulfonium hexafluoroantimonate (Midori-Kagura). Development was done at room temperature using MIBK for 30 seconds, followed by rinsing with isopropanol for 30 seconds. All post-apply bakes (PABs) were done at 90° C. for 2 minutes unless otherwise noted and all post-exposure bakes (PEBs) were all done for 1 minute unless otherwise noted.

Film thicknesses were measured using a M-2000 spectroscopic ellipsometer (J.A. Woolam, Inc.) over the wavelength range from 350 to 1000 nm. For e-beam lithography, the resist solution was spin-coated onto a 46 nm thick silicon nitride membrane window contained in a silicon wafer support structure. The resist film was exposed using a JEOL JBX-9300FS electron-beam lithography system with a 100 keV acceleration voltage, 2 nA current, and 10 nm single-pixel shot pitch. The patterns produced by e-beam lithography were imaged using a LEO 1530 thermally assisted field emission SEM with 2 keV acceleration voltage. The original image was off-line processed with background intensity subtraction and adaptive Gaussian-noise filtering. Critical dimension (CD) measurements and the whole spatial-frequency 3σ LER and 3σ LWR spectra of the resist pattern were averaged from 10 different line-space patterns with a 1 μm measurement length.

4-Ep.

The e-beam contrast curve for 4-Ep with a PEB of 90° C. for 1 minute and 10 minutes is shown in FIG. 24. The resist has good sensitivity, and shows little dependence on the PEB time, with the dose to 50% normalized film thickness ($E_{50}$) of 22 μC/cm$^2$ for the 1 minute PEB and 21 μC/cm$^2$ for a PEB of 10 minutes. Contrast ratio (γ) was also only weakly affected by increasing the PEB time; γ was 1.5 for the 1 minute PEB and γ was 1.6 for the 10 minute PEB. This relative insensitivity to bake time is somewhat expected since the resist begins to crosslink as soon as it is exposed. It is also likely that for the lower doses, extending the PEB time has little effect on increasing the molecular weight because the few active cationic polymerization centers that were initiated have already carried out extensive cross-linking. At higher doses there is some bake time effect because there are more active sites that still can provide further cross-linking during longer bakes.

Three different PEB times at 90° C. were used to compare the effect of bake time on resolution and imaging performance: 1 minute, 5 minutes, and 10 minutes. FIG. 25 shows SEM images of 35 nm 1:1 line-space features for each bake time. As FIG. 25 shows, performance was virtually identical for each bake time. The resist was able to resolve 1:1 line-space patterns down to 35 nm half-pitch at a dose-to-size of 50 μC/cm$^2$ for all three bake conditions. It may yet be possible to resolve smaller features in this material using different imaging doses and further formulation and process optimization. Overall, the effect of bake time had little effect on the resist performance both from pattern-to-pattern on a sample and from sample-to-sample. The maximum standard deviation in critical dimension (CD) from line-to-line on each sample was 0.9 nm, and the maximum difference in average line width from sample-to-sample was 0.5 nm. This is indicates that the CD variation of this family of compounds is minimal with minor variations in PEB time.

Some features smaller than 35 nm were resolved, but they began to suffer from line widening, with the developed lines becoming wider than the nominally patterned feature. The line widening could possibly be due to acid diffusion, but is more likely due to lateral propagation of the polymerization front beyond the line-edge since the active acid exists for a very short time before protonating an epoxide, after which time it exists as an active cationic polymerization center on the end of a growing chain. The problem can be improved by using different formulation strategies or processing conditions such as a PEB at a lower temperature. Such material and process permutation experiments have shown sub-30 nm resolution in this material. If spatial propagation of the polymerization serves to blur the image, it must be at very small length scales (i.e. <~10 nm blur based on the beam spot size in these tests and the ~30 nm feature size where line widening is observed as feature size is reduced).

The pattern collapse behavior of this material is also excellent. There appeared to be no major occurrence of pattern collapse for an 80 nm thick film. This means that the resist could obtain an aspect ratio of at least 2.5:1 for 1:1 line/space patterns down to feature sizes of roughly 30 nm. This is not unexpected, and it is well known that similar types of resist materials (e.g. phenolic epoxide resists such as SU-8) are able to resolve very high aspect features.

The line edge roughness of the resist was determined using 70 nm half-pitch lines with an inspection length of 1 μm. The LER (3σ) was 2.3 nm and line width roughness (LWR) (3σ) was 3.2 nm for each of the different PEB bake times. These are as small as any LER values reported for a photoresist and are the same values obtained for 3-Ep, indicating that good LER performance in these systems can be obtained for a variety of molecular structures.

3-Ep.

Unlike 4-Ep, 3-Ep had to be soft baked or post apply baked (PAB) at 60° C. or less because the film dewets from the silicon substrate when processed at higher temperatures due to the low melting point of the small 3-Ep molecule containing the flexible glycidyl ethers. While this limited the temperatures that could be used for the PAB, the post exposure bake could be carried out above 60° C. because even the low level of cross-linking that occurs after exposure at room temperature is enough to raise the glass transition temperature enough to prevent dewetting in the exposed area. After exposure, 3-Ep and the other similar molecular resists show no change in film thickness or shrinkage during the PEB. This is unlike most positive tone CARs which have some thickness loss during the PEB due to volatilization of removed protecting groups. This also implies that these negative tone molecular resists should show little-if-any outgassing during exposure under high vacuum e-beam or EUV exposure, eliminating a growing concern in resists for next generation lithography.

FIG. 26 shows e-beam contrast curves for 3-Ep for different PEB temperatures. In e-beam, 3-Ep shows similar good sensitivity to 4-Ep with a $E_{50}$ of 20 μC/cm². It has a similar contrast ratio of 1.5. A wide range of PEB temperatures from at least 60-90° C. can be used in these materials with minimal effect on contrast performance. The only major difference between the two PEB temperatures is that at 90° C., the final film thickness is the same as before development, while at 60° C., there is still around 20% dark loss even at high doses. This is likely due to the fact that at the higher PEB temperature, there is more mobility in the film which leads to a higher extent of cross-linking.

Just like 4-Ep, 3-Ep showed excellent high resolution imaging. FIGS. 27 A-C show 80 nm 1:1 line/space patterns for 3-Ep with a PEB of 60° C., and 50 nm 1:1 line/space and 30 nm 1:3 line/space patterns for 3-Ep with a PEB of 90° C., all at a dose-to-size of 50 μC/cm². For a PEB of 90° C., 3-Ep resolved 1:1 patterns down to 50 nm and 1:3 patterns down to 30 nm; while for a PEB of 60° C., 3-Ep gave excellent 1:1 patterns down to 55 nm and 1:3 patterns down to 40 nm. The failure at smaller pitch sizes was not due to image blurring in this case, but was due to pattern collapse as the aspect ratio of features increased due to the pattern size decreasing at a constant film thickness of 110 nm. The PEB of 90° C. gave smaller features than a PEB of 60° C. because the higher PEB temperature leads to a higher level of cross-linking that produces more robust features. Other than the pattern collapse behavior, no discernable difference in the blurring and LER performance could be found between the two PEB temperatures. This shows that these materials can be imaged at variety of PEB temperatures which could be important since reduced PEB temperature might improve absolute resolution of these materials by reducing line blurring. As mentioned earlier, 3-Ep showed excellent LER and line-width-roughness (LWR) similar to that observed in 4-Ep. Using the 80 nm 1:1 line/space patterns, a LER (3σ) of 2.3 nm and LWR (3σ) of 3.4 nm were obtained. These are very low values for LER, much lower than the 5 nm minimum that is commonly reported for conventional CARs.

2-Ep.

Contrast curves for 2-Ep using 100 keV e-beam are shown in FIG. 28 for a PEB of 90° C. and 110° C. The lower dose region looks very similar in both cases with $E_{50}$ of 38 μC/cm². The higher dose regions show more differences, with the 90° C. PEB curve reaching a limiting value of 75% remaining film thickness and the 110° C. curve eventually approaching 100% remaining film thickness at high doses. Experiments were also carried out for a PEB temperature of 60° C., but a limiting value of only 25% remaining film thickness could be obtained. Increasing the PEB temperature increases the final film thicknesses because the higher temperatures allow for higher levels of cross-linking at the higher doses. The contrast ratio is 1.4 for a PEB of 110° C. and 1.3 for a PEB of 90° C. Although these are relatively small values for contrast as compared to positive tone CARs that can have contrast values on the order of 10 and larger, the 2-Ep contrast is in the range more typical of other negative tone high resolution resists like HSQ.

SEM images of the high resolution patterning of 2-Ep under 100 keV e-beam are shown in FIGS. 29 A-C for a 90° C. PEB with a dose-to-size of 75 μC/cm². The film thickness of these patterns is around 50-60 nm. All patterns printed the correct nominal size down to 25 nm half-pitch for a PEB of 90° C. Smaller patterns, which were nominally 20 nm, printed at approximately 22-25 nm in size. The 20 nm 1:1 line/space failed due to pattern collapse at the attempted film thickness of 50-55 nm (aspect ratio >2:1) which is why 20 nm 1:2 line/space patterns are shown. Despite the bending of some 25 nm lines, 2-Ep is very clearly is capable of resolving 25 nm hp, and future work can likely improve that to being capable of resolving features on the order of 20 nm and smaller by focusing on mitigating pattern collapse and reducing the extent of polymerization front propagation.

The LER and LWR of 2-Ep for a PEB of 90° C. was determined. For 50 nm hp lines, the LER (3σ) was 2.8 nm and LWR (3σ) was 4.0 nm. For 30 nm hp lines shown in FIG. 26, the LER (3σ) was 2.9 nm and LWR (3σ) was 4.2 nm. This is a small value for LER, but slightly higher than 3-Ep and 4-Ep.

SU-8.

Although SU-8 is probably more accurately classified as an oligomer rather than a molecular glass, the similarities of it with the three molecular glass resists used by our group suggests that its high resolution performance should be compared to the molecular resists. Patterning of high resolution line features in SU-8 has been previously reported at resolutions down to 24 nm, but none of the reports of such high resolution features have achieved these results in dense patterns. Based on our experience with the other molecular resists, a PEB of 60° C. was used to pattern high resolution line/space patterns in SU-8 using 100 keV e-beam with a film thickness of 60 nm. The patterning results for SU-8 are shown in FIG. 30 for a dose-to-size of 40 µC/cm². The 100 nm 1:1 line/space patterns were well-resolved with the correct line and space widths. When the pattern size was reduced, the patterning performance degraded. The 70 nm 1:1 patterns shown some line bending and bridging, while the 65 nm 1:1 patterns show significant bridging. Despite the fact that the 65 nm 1:1 patterns fail to completely resolve, the 65 nm 1:2 line/space patterns are well resolved cleanly. This same result is encountered throughout experiments where feature was reduced and more relaxed pitches were printed. As the feature size is reduced, dense lines are observed to have significant bridging failures until the pitch is relaxed to a sufficient value and the pitch required becomes more relaxed as feature size decreases. In other words, as the feature size shrinks the features must be placed farther and farther apart to prevent bridging failure.

This particular mode of failure in SU-8 appears to be due to swelling. It does not appear to fail by pattern collapse because the aspect ratio never becomes greater than 2:1 in the patterns imaged in this work. Likewise, SU-8 appears capable of resolving sub-40 nm patterns because there is no significant line-widening or blurring, implying that the failure is not due to inability to pattern individual lines to that size. The biggest indicator of swelling is that for sub-100 nm patterns, generally dense features fail due to bridging while less dense features pattern cleanly. This is because the less dense features can swell without touching each other while in the swollen state, but since the more dense features are closer together they touch while swollen and such point contacts remain and distort the features even after drying of the resist pattern. It appears that in the case of SU-8 processed as described in this work, that a critical space width between features on the order of approximately 100 nm is really required for clean imaging. While optimization of SU-8 processing could potentially improve this swelling failure, it is likely that swelling is a limiting factor for the ability to print dense high resolution features in SU-8.

Comparison of the Resists.

Many of the differences in the performance results for each of the resists can be explained by assuming that the solubility and dissolution rate of each resist is the same as a function of molecular weight. This is reasonable considering the structural similarity of each resist implies that they all should have similar interactions with the same developing solvent. One expected result is that the dose-to-size decreases as the degree of functionality increases. This is expected because the larger, more functionalized SU-8 has a larger increase in molecular weight for every individual cross-link; a single cross-link in SU-8 would give a dimer with a molecular weight of nearly 2795.4, while a 4-Ep dimer would only have a molecular weight of around 1245.4. SU-8 would require significantly fewer cross-links to obtain an insoluble molecular weight. 2-Ep is much less sensitive than 3-Ep because it has few epoxides per resist molecule, even though it has nearly the same molecular weight. Since it has fewer sites that can cross-link, more polymerization events, which translates into a higher exposure dose, is required to reach the same molecular weight as 3-Ep.

The differences in cross-link density also possibly explain the differences in the imaging performance of SU-8 compared to the other molecular resists. As discussed earlier, since SU-8 requires fewer cross-links to reach a near insoluble molecular weight, its network structure likely has a lower cross-link density than 4-Ep or the other molecular resists. Since it has a less dense network, it can imbibe more solvent during the development which then leads to the swelling that causes the bridging defects and pattern failure in dense features.

The superior resolution in these epoxide molecular glass materials relative to most conventional CARs is likely due to the fact that they use cationic polymerization as a resist solubility changing mechanism. The resist resolution should be controlled by the propagation of the polymerization front rather than photo-acid diffusion and the propagation of the deprotection reaction front as is common in current positive tone CARs. Since the polymerizing ionic active site will be on an increasingly larger chain or network as the reaction proceeds, the rate of propagation will rapidly reduce in the glass as the chain grows larger to act as a self-regulating process to some degree. The rate of propagation locally could also be reduced due to the fact that the glass transition temperature of the resist locally in the vicinity of the polymerization should increase as the degree of cross-linking increases which can have an impact on the kinetics of the reaction and the mobility locally of species in the film.

Comparing the best resolution of each of the molecular resists, 2-Ep has superior resolution to 3-Ep and 4-Ep. This could be due to the fact that it has reduced mobility of the active cation during cross-linking as a result of the higher glass transition temperature in the un-crosslinked 2-Ep glass. Additional factors such as differences in extent of swelling, different chain lengths in the final network structure, different kinetics of polymerization, and other factors may also contribute to the observed behavior.

Conclusion.

A series of negative tone epoxide functionalized molecular resists were synthesized and patterned using high resolution e-beam lithography. They all showed superior performance to SU-8 which was resolution limited due to swelling. 3-Ep is a tri-functional epoxide resist that has shown 30 nm resolution, a sensitivity of 20 µC/cm², and 2.3 nm LER (3σ). 4-Ep is a tetra-functional epoxide resist that has shown 35 nm 1:1 half-pitch (hp) resolution, a sensitivity of 22 µC/cm², and 2.3 nm LER (3σ). The di-functional 2-Ep was found to exhibit excellent resolution of <25 nm half-pitch, good sensitivity of 38 µC/cm², and low LER and LWR (2.9 nm and 4.2 nm for 30 nm half-pitch). All of these types of materials were able to obtain an excellent combination of resolution, LER, and sensitivity, and merit further study as high performance resists for next generation lithography.

The various embodiments of the present invention are further illustrated by way of the examples contained herein, which are provided for clarity of understanding. The exemplary embodiments should not to be construed in any way as imposing limitations upon the scope thereof. On the contrary, it is to be clearly understood that resort may be had to various other embodiments, modifications, and equivalents thereof which, after reading the description herein, may suggest themselves to those skilled in the art without departing from the spirit of the present invention and/or the scope of the appended claims.

Therefore, while embodiments of this invention have been described in detail with particular reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

The invention claimed is:

1. A negative tone molecular glass-based resist, comprising:
   a molecular glass, comprising:
      a molecular glass core, wherein the molecular glass core is not a polymer chain; and
      a functional group bound to the molecular glass core and configured to provide a decrease in solubility of the molecular glass; and
   an initiating component configured to produce a reactive species upon exposure to radiation, wherein the reactive species facilitates the decrease in solubility of the molecular glass
   wherein the initiating component comprises a portion of the molecular glass.

2. The negative tone molecular glass-based resist of claim 1, wherein the molecular glass core is a polyphenol, a cyclic compound, an arylbenzene, steroid, a sterol, a cholate, or comprises a spiroatom.

3. The negative tone molecular glass-based resist of claim 2, wherein the cyclic compound is a calixarene.

4. The negative tone molecular glass-based resist of claim 1, wherein the initiating component is a photo-acid generator, a photo-base generator, or a photo-radical generator.

5. The negative tone molecular glass-based resist of claim 4, wherein the reactive species is a photo-acid when the initiating component is the photo-acid generator, a photo-base when the initiating component is the photo-base generator, or a free radical when the initiating component is the photo-radical generator.

6. The negative tone molecular glass-based resist of claim 5, wherein the photo-acid catalyzes a condensation between functional groups of adjacent molecular glasses, the photo-acid catalyzes an intramolecular dehydration within the molecular glass, the photo-acid catalyzes a rearrangement between functional groups of adjacent molecular glasses, the photo-acid catalyzes an intramolecular rearrangement of the functional group within the molecular glass, the photo-acid catalyzes an esterification between functional groups of adjacent molecular glasses, the photo-acid catalyzes an etherification between functional groups of adjacent molecular glasses, or the photo-acid catalyzes an intramolecular etherification between two functional groups within the molecular glass.

7. The negative tone molecular glass-based resist of claim 5, wherein the photo-base reacts with functional groups of adjacent molecular glasses, thereby cross-linking the adjacent molecular glasses.

8. The negative tone molecular glass-based resist of claim 5, wherein the photo-base generator comprises a portion of the molecular glass core of the molecular glass, and wherein the photo-base reacts with a functional group of an adjacent molecular glass, thereby cross-linking the molecular glass with the adjacent molecular glass.

9. The negative tone molecular glass-based resist of claim 5, wherein the free radical catalyzes a polymerization of the functional group of adjacent molecular glass molecules, thereby cross-linking the adjacent molecular glass molecules.

10. A method of making a resist, the method comprising:
   dispensing a negative tone molecular glass-based material on a substrate, wherein the negative tone molecular glass-based material comprises:
      a molecular glass, comprising:
         a molecular glass core, wherein the molecular glass core is not a polymer chain; and
         a functional group bound to the molecular glass core and configured to provide a decrease in solubility of the molecular glass,
      an initiating component configured to produce a reactive species upon exposure to radiation, wherein the reactive species facilitates the decrease in solubility of the molecular glass by reaction between or within molecular glass functional groups;
         wherein the initiating component comprises a portion of the molecular glass
   exposing at least a portion of the negative tone molecular glass-based material to radiation; and
   reducing the solubility of at least a portion of the exposed negative tone molecular glass-based material.

11. The method of making the resist of claim 10, further comprising removing at least a portion of the negative tone molecular glass-based material that was not exposed to the radiation from the substrate.

12. The method of making the resist of claim 11, wherein the removing comprises:
   contacting the negative tone molecular glass-based material with a developing agent; and
   dissolving or carrying the at least the portion of the negative tone molecular glass-based material that was not exposed to the radiation from the substrate.

13. The method of making the resist of claim 10, wherein the reducing occurs during a post-exposing thermal treatment.

14. The method of making the resist of claim 10, wherein the initiating component of the negative tone molecular glass-based material is a photo-acid generator, a photo-base generator, or a photo-radical generator.

15. The method of making the resist of claim 14, wherein the reactive species is a photo-acid, when the initiating component is the photo-acid generator, a photo-base when the initiating component is the photo-base generator, or a free radical when the initiating component is the photo-radical generator.

16. The method of making the resist of claim 15, wherein the reducing comprises, a photo-acid catalyzed condensation between functional groups of adjacent molecular glasses, a photo-acid catalyzed intramolecular dehydration within the molecular glass, a photo-acid catalyzed intramolecular dehydration within the molecular glass, a photo-acid catalyzed rearrangement between functional groups of adjacent molecular glasses, a photo-acid catalyzed intramolecular rearrangement of the functional group within the molecular glass, a photo-acid catalyzed esterification between functional groups of adjacent molecular glasses, a photo-acid catalyzed etherification between functional groups of adjacent molecular glasses, a photo-acid catalyzed intramolecular etherification between two functional groups within the molecular glass, a reaction between the photo-base and functional groups of adjacent molecular glasses thereby cross-linking the adjacent molecular glasses, or a free radical catalyzed polymerization of the functional group of adjacent molecular glass molecules thereby cross-linking the adjacent molecular glass molecules.

17. The method of making the resist of claim 15, wherein the photo-base generator comprises a portion of the molecular glass core of the molecular glass, and wherein the reducing comprises a reaction between the photo-base and a functional group of an adjacent molecular glass, thereby cross-linking the molecular glass with the adjacent molecular glass.

* * * * *